(12) United States Patent
Chiba

(10) Patent No.: US 6,208,950 B1
(45) Date of Patent: Mar. 27, 2001

(54) NOISE REDUCTION METHOD FOR A SEMICONDUCTOR DEVICE

(75) Inventor: Kazuhiro Chiba, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/025,317

(22) Filed: Feb. 18, 1998

(30) Foreign Application Priority Data

Feb. 18, 1997 (JP) ........................................ 9-033750

(51) Int. Cl.⁷ .................................................... G06F 17/50
(52) U.S. Cl. ............................. 702/191; 702/69; 324/765
(58) Field of Search .................... 702/19.1, 69; 324/665; 438/182, 572, 577, 578; 327/530, 538; 73/769, 777, 613, 614

(56) References Cited

U.S. PATENT DOCUMENTS 5,610,090 * 3/1997 Jo ............................................. 437/39
5,733,827 * 3/1998 Tehrani et al. ....................... 438/572

FOREIGN PATENT DOCUMENTS 8-105794    4/1996 (JP).
8-186253    7/1996 (JP).

* cited by examiner

Primary Examiner—Kamini Shah
(74) Attorney, Agent, or Firm—Sughrue, Mion, Zinn, Macpeak & Seas, PLLC

(57) ABSTRACT

A 1/f noise coefficient characteristic with respect to an operating point of a semiconductor device is measured, and a control voltage corresponding to an operating point of the semiconductor device with which the 1/f noise coefficient is minimized is applied to a MOSFET. Further, using a MOSFET which has known element dimensions, a relationship of a 1/f noise coefficient to a channel area is calculated, and the resistance value of the MOSFET is calculated using the channel width and the channel length as well as a constant peculiar to the MOSFET. Then, the 1/f noise coefficient of the semiconductor device is calculated using the 1/f noise coefficient with respect to the channel area of the MOSFET and the resistance value, and the channel width and the channel length of the MOSFET are set so that the 1/f noise coefficient of the semiconductor device may be minimized.

8 Claims, 12 Drawing Sheets

NOISE REDUCTION METHOD FOR A SEMICONDUCTOR DEVICE

BACKGROUND OF THE INVENTION

1. Field of the Invention

This invention relates to a noise reduction method for reducing 1/f noise of a semiconductor device which includes an element having an impedance and a MOSFET (Metal Oxide Semiconductor Field Effect Transistor).

2. Description of the Related Art

Usually, noise components of a semiconductor device include 1/f noise and Johnson noise, and where the semiconductor device is a sensor or a like element of the temperature detection type for use with an infrared detector, thermal fluctuation noise caused by thermal energy inputted to it is produced additionally.

In order to improve the signal to noise ratio (hereinafter referred to simply as S/N ratio) of a semiconductor device, in a device which at least includes an element having an impedance and a MOSFET, which is reputed to have high 1/f noise, the 1/f noise in particular above must be reduced.

It is to be noted that (S/N ratio)=(effective value of signal)/(effective value of noise).

If noise of a semiconductor device is noise on current, then noise current spectrum density $Sn1/f$ [$A^2$/Hz] and noise current effective value $In1/f$ [A] representative of the magnitude of 1/f noise can be represented by the following expressions:

$$Sn1/f = K \cdot Ib^2/f \quad (1)$$

$$In1/f = (\int_{f1}^{f2} Sn i df)^{1/2} = \{K \cdot Ib^2 \cdot \ln(f2/f1)\}^{1/2} \quad (2)$$

where K is the 1/f noise factor, Ib is the bias current [A] to flow through the semiconductor device, f is the frequency [Hz], f1 is the lowest frequency [Hz] in a measurement band, and f2 is the highest frequency [Hz] in the measurement band.

As seen from expressions (1) and (2), noise current spectrum density $Sn1/f$ [$A^2$/Hz] and noise current effective value $In1/f$ [A] of 1/f noise rely upon the value of bias current Ib to flow through the semiconductor device, and if bias current Ib increases, also 1/f noise increases.

Meanwhile, noise current effective value InJ of Johnson noise and noise current effective value Inth of thermal fluctuation noise can be represented, when an infrared sensor of the bolometer type used in an infrared detector or the like as a semiconductor device is taken as an example, by the following expressions:

$$InJ = \{4 \cdot k \cdot T \cdot (f2-f1)/R\}^{1/2} \quad (3)$$

$$Inth = Ib \cdot \alpha \cdot T \cdot (k/Cth)^{1/2} \quad (4)$$

where R is the total resistance value [Ω] of the semiconductor device, k is the Boltzmann's constant [eV/K], T is the temperature [K] upon measurement, α is the temperature coefficient of the bolometer type infrared sensor resistance [1/K], and Cth is the heat capacity [J/K].

By the way, the magnitude of signal component Is outputted from the semiconductor device can be represented, where a bolometer type infrared sensor which is used with an infrared ray detector or the like is taken as an example (refer to, for example, Brugess R. Johnson et al., "Silicon Microstructure Superconducting Microbolometer Infrared Arrays", SPIE, Vol. 2,020, Infrared Technology XIX, 1993), by the following expression:

$$Is = \alpha \cdot \Delta T \cdot Ib \quad (5)$$

where α is the temperature coefficient [1/K] of the resistance of the bolometer type infrared sensor, ΔT is the temperature rise [K] of a diaphragm when an object of measurement having a temperature difference of 1° K from the surroundings is observed, and Ib is the bias current [A] to flow through the semiconductor device.

Using noise current effective value In1/f of 1/f noise, noise current effective value InJ of Johnson noise and noise current effective value Inth of thermal fluctuation noise, the S/N ratio of the semiconductor device can be represented by the following expression:

$$S/N \text{ ratio} = \frac{I_S}{(In1/f^2 + InJ^2 + Inth^2)^{1/2}} \quad (6)$$

Of the noise components of a semiconductor device, the thermal fluctuation noise has a value much lower than those of the Johnson noise and the 1/f noise, and therefore, the thermal fluctuation noise can be ignored. The thermal fluctuation noise is noise peculiar to a sensor of the temperature detection type such as an infrared detector, and matters only when the Johnson noise and the 1/f noise are very low.

By the way, when bias current Ib to flow through the semiconductor device is low, Johnson noise becomes a principal noise component of noise of the semiconductor device. On the other hand, when bias current Ib to flow through the semiconductor device is high, since also the 1/f noise increases as bias current Ib increases, the 1/f noise becomes a principal noise component of the semiconductor device.

In a range of bias current Ib in which Johnson noise is outputted as a principal noise component, if bias current Ib is increased, then signal component Is increases, and therefore, the S/N ratio can be improved. This is due to the fact that, as seen from expression (3) above, the Johnson noise is fixed without relying upon bias current Ib.

However, if bias current Ib is further increased to a value in another range of bias current Ib in which 1/f noise is outputted as a principal noise component, then improvement of the S/N ratio can no longer be expected. This arises from the fact that, if bias current Ib increases, then simultaneously as signal component Is increases as seen from expression (5), also the 1/f noise increases as seen from expression (2).

Accordingly, in order to improve the S/N ratio, signal component Is must be increased while suppressing an increase of the noise components.

This is described taking a bolometer type infrared sensor as an example. In order to increase signal component Is, as can be seen from expression (5), temperature coefficient α, temperature rise ΔT of the diaphragm and bias current Ib should be increased.

In order to increase temperature rise ΔT of the diaphragm, it is necessary to reduce the thermal conductance or increase the absorption factor of infrared rays of the diaphragm to improve the sensitivity of the sensor. Meanwhile, in order to increase temperature coefficient α of the resistance, it is necessary to develop an infrared sensor of the bolometer type having a high temperature coefficient. However, the countermeasures just described cannot be realized readily because a high development cost and a long development time are required. Therefore, in order to increase signal component Is, the most easy and effective countermeasure is to increase bias current Ib.

On the other hand, in order to suppress an increase of noise components, a method such as forming each element of a semiconductor device from a material which produces a minimized amount of noise or to devise the structure of elements to suppress an increase of noise seem to be applicable.

For example, since the magnitude of Johnson noise relies upon the resistance value of an element, production of Johnson noise can be suppressed by making the resistance value of the element high. However, if the resistance value of the element is made high, then the operating voltage of the element becomes high and the margin for the dielectric strength is reduced, and consequently, the applied voltage is limited and bias current Ib cannot be increased. Therefore, signal component Is cannot be increased.

Meanwhile, although the 1/f noise can be reduced by forming the element from a material having a low 1/f noise coefficient, this gives rise to another problem in that temperature coefficient α of the resistance and so forth are deteriorated.

Another method of devising the structure of an element to suppress the noise production amount is disclosed, for example, in Japanese Patent Laid-Open No. 186253/96. In the conventional noise reduction method disclosed in Japanese Patent Laid-Open No. 186253/96, impurity diffusion regions are formed at locations spaced from the surface of a silicon substrate and are used as the source and the drain such that the channel may not contact with a gate oxide film to reduce the 1/f noise of the MOSFET.

With such a conventional noise reduction method for a semiconductor device as described above, since the noise increases and the S/N ratio cannot be improved in the range of bias current Ib in which 1/f noise is outputted as a principal noise component. Bias current Ib must be limited to a range within which 1/f noise does not become a principal noise component.

Accordingly, in order to obtain a high S/N ratio in this condition, an increase of signal component Is is inevitable. However, in order to increase signal component Is, it is necessary to develop a material having a high temperature coefficient of the resistance or a new element or structure for improving the sensitivity. Consequently, there is a problem that a high cost and much time are required in order to develop a material or a structure or establish a production method which satisfies this requirement.

Here, while it may be a possible idea to use, as a material for the element, a metal oxide or the like which has a high temperature coefficient of the resistance such as vanadium oxide (VOx), in order to form an element from vanadium oxide, a special manufacture line is required and the production cost is increased because it is difficult to use a manufacture line which is used for formation of elements using silicon.

Also where an element is formed from a material having a low 1/f noise coefficient to reduce noise components to improve the S/N ratio or where the structure of an element is devised to reduce noise components to improve the S/N ratio, in order to develop the material and establish a manufacture method, a high cost and much time are required. Consequently, there is a problem that the production cost becomes high. If a special structure which reduces the 1/f noise coefficient as in a MOSFET which is disclosed, for example, in Japanese Patent Laid-Open No. 186253/96 is adopted, then the structure and the production process of the element are complicated. Consequently, an increase of the production cost cannot be avoided.

SUMMARY OF THE INVENTION

Accordingly, it is an object of the present invention to provide a noise reduction method for a semiconductor device which can suppress an increase of noise components by an increase of bias current to improve the S/N ratio.

It is another object of the present invention to provide a noise reduction method for a semiconductor device which can improve the S/N ratio without using a special material or without adding a special driving circuit.

In order to achieve the objects described above, according to the present invention, there is provided a noise reduction method for a semiconductor device for suppressing a noise component of a semiconductor device which includes an element having an impedance and a MOSFET circuit which includes at least one MOSFET, comprising the steps of measuring a 1/f noise coefficient characteristic indicative of a relationship of a 1/f noise coefficient to an operating point of the semiconductor device using a control voltage to be applied to a gate of the MOSFET as a parameter, and applying, based on the 1/f noise coefficient characteristic, a control voltage corresponding to an operating point of the semiconductor device with which the 1/f noise coefficient is minimized within a range within which the MOSFET is operable. By the construction just described, even if bias current of the semiconductor device is increased to increase a signal component, the amount of 1/f noise which may be produced is suppressed.

Further, when the MOSFET circuit is composed of a P-channel MOSFET and an N-channel MOSFET connected in parallel, by applying a second control voltage which is a predetermined optimum voltage to the substrate of the P-channel MOSFET, the 1/f noise coefficient can be further reduced.

On the other hand, when a noise reduction method for a semiconductor device comprises the steps of calculating, using a MOSFET having known element dimensions, a relationship of a 1/f noise coefficient to a channel area of the MOSFET, calculating resistance values of the MOSFET and a MOSFET circuit using a channel width and a channel length set from the channel area and a peculiar constant of the MOSFET, calculating a 1/f noise coefficient of the semiconductor device using thus calculated values, and setting the dimensions of the MOSFET so that the 1/f noise coefficient of the semiconductor device may be minimized, an external circuit for minimizing the 1/f noise coefficient becomes unnecessary and the construction of the semiconductor device can be simplified.

The above and other objects, features, and advantages of the present invention will become apparent from the following description with references to the accompanying drawings which illustrate example of the present invention.

DETAILED DESCRIPTION OF THE PREFERRED EMBODIMENTS (First Embodiment)

First, a first embodiment of the present invention is described.

The first embodiment provides a method wherein, taking note of the fact that, when a gate voltage (control voltage) of a MOSFET of a semiconductor device is used as a parameter, the 1/f noise coefficient of the semiconductor device relies upon the operating point determined by bias current of the semiconductor device, a signal component is increased while suppressing an increase of 1/f noise to improve the S/N ratio by causing the semiconductor device to operate with the operating point and control voltage which minimize the 1/f noise coefficient.

(First Working Example)

While the first embodiment of the noise reduction method for a semiconductor device of the present invention can be applied to various semiconductor devices, the present working example is described taking a case where the noise reduction method is applied to an infrared sensor of the bolometer type as an example.

Figure 1:
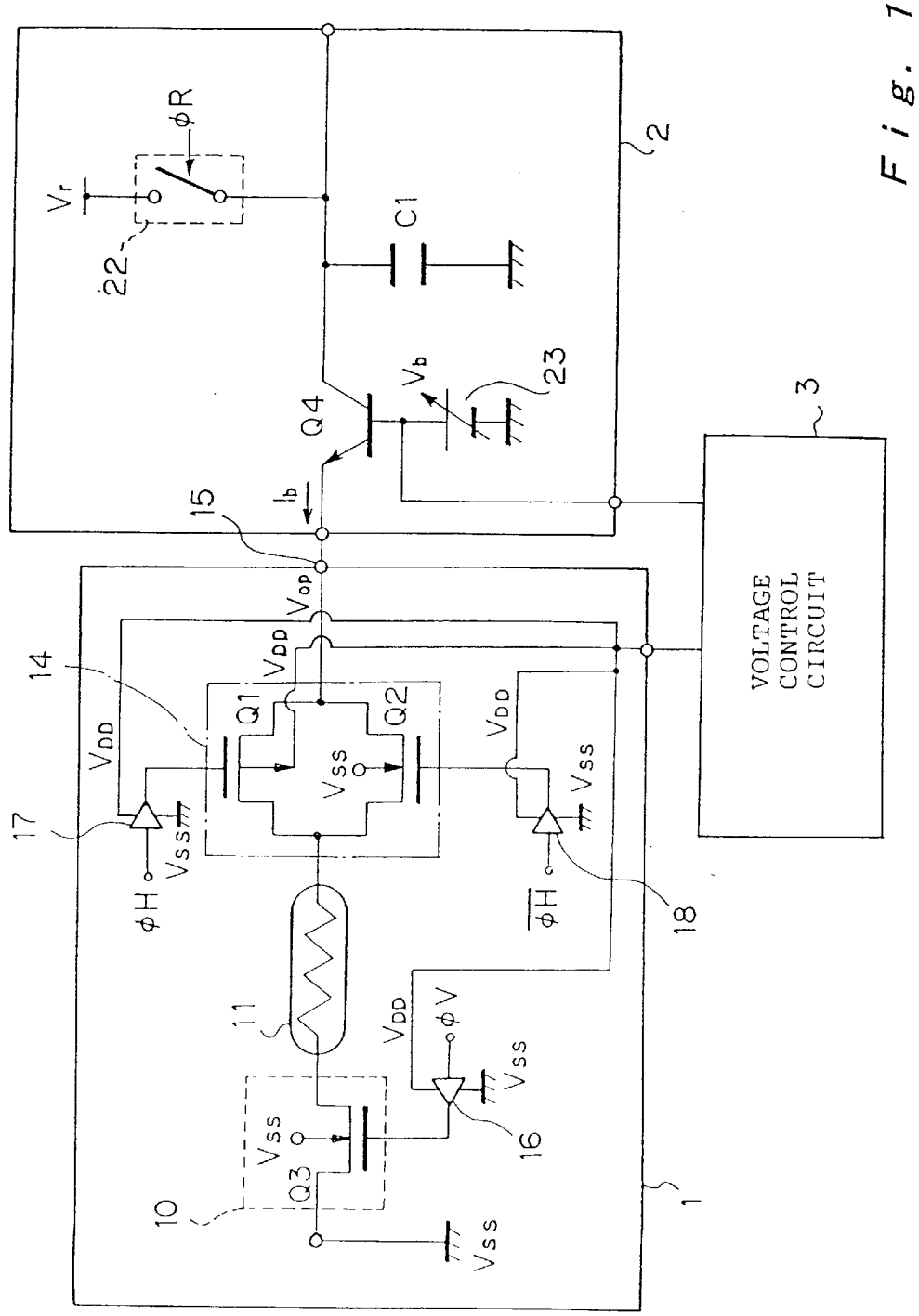
FIG. 1 is a block diagram showing a construction of an apparatus to which a first embodiment of a noise reduction method for a semiconductor device of the present invention is applied.

Referring to FIG. 1, semiconductor device 1 of the present working example includes bolometer 11 formed from a thermoelectric conversion element, horizontal switch 14 formed from first P-channel MOSFET Q1 and first N-channel MOSFET Q2 connected in parallel, and vertical switch 10 formed from second N-channel MOSFET Q3 grounded at the source thereof and connected at the drain thereof to an end of bolometer 11.

Here, an end of horizontal switch 14 is connected to the other end of bolometer 11, and the other end of horizontal switch 14 is connected to output terminal 15.

Connected to the gate of first P-channel MOSFET Q1 of horizontal switch 14 is first buffer 17 which outputs one of predetermined control voltage VDD applied to a power supply terminal and ground potential Vss in response to horizontal switch selection signal φH. Meanwhile, to the gate of first N-channel MOSFET Q2, second buffer 18 which outputs one of control voltage VDD applied to the power supply terminal and ground potential Vss in response to a negated value of horizontal switch selection signal φH is connected.

Further, a substrate (body) of first P-channel MOSFET Q1 is connected to voltage control circuit 3 so that control voltage VDD is applied to the substrate of first P-channel MOSFET Q1. Meanwhile, a substrate of first N-channel MOSFET Q2 is grounded.

Meanwhile, a substrate of second N-channel MOSFET Q3 of vertical switch 10 is grounded, and to the gate of second N-channel MOSFET Q3, third buffer 16 which outputs one of control voltage VDD applied to the power supply terminal and ground potential Vss in response to vertical switch selection signal φV is connected.

It is to be noted that, for bolometer 11, titanium or a material which contains titanium as a principal component or else a metal oxide film having a thermoelectric conversion characteristic may be employed.

In a construction such as described above, vertical switch 10 and horizontal switch 14 exhibit on-states only when vertical switch selection signal φV has the High level and horizontal switch selection signal φH has the Low level, respectively. In this instance, control voltage VDD is applied to the gate of second N-channel MOSFET Q3 of vertical switch 10 and ground potential Vss is applied to the gate of first P-channel MOSFET Q1 of horizontal switch 14, and control voltage VDD is applied to the gate of first N-channel MOSFET Q2.

Read-out circuit 2 includes transistor Q4 for reading out a signal detected by semiconductor device 1, capacitor C1 for integrating and outputting the signal read out by transistor Q4, reset circuit 22 which connects an output of capacitor C1 to power supply Vr to charge capacitor C1 so that charge accumulated in capacitor C1 may be equal to the potential of power supply Vr, and bias voltage supply 23 connected to the base of transistor Q4 for controlling bias current Ib to be supplied to semiconductor device 1.

It is to be noted that reset circuit 22 performs a switching operation in response to predetermined periodical pulse φR transmitted thereto from control means not shown to connect the potential of capacitor C1 to power supply Vr in a predetermined period.

In a construction such as described above, predetermined bias current Ib is supplied from transistor Q4 of read-out circuit 2 through output terminal 15 to horizontal switch 14, bolometer 11 and vertical switch 10 of semiconductor device 1. In this instance, the value of bias current Ib to be supplied from the emitter of transistor Q4 is determined and operating point Vop of semiconductor device 1 is determined by the value of voltage Vb applied to the base of transistor Q4.

It is to be noted that the relationship between operating point Vop and bias current Ib is Vop=Ib×R where the total resistance of semiconductor device 1 is R. In the case of semiconductor device 1 shown in FIG. 1, since the resistance value is approximately 3,300 [Ω], Vop=3,300×Ib.

Figure 2:
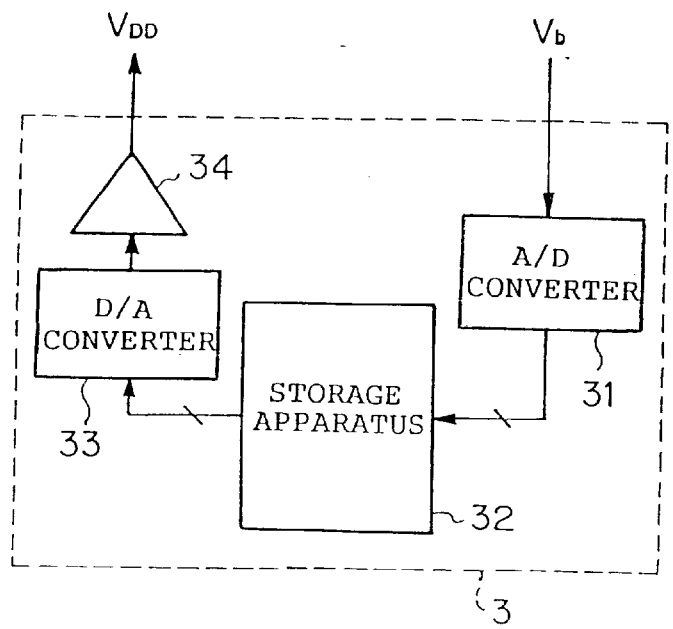
FIG. 2 is a block diagram showing a construction of a first working example of a voltage control circuit shown in FIG. 1.

Referring to FIG. 2, voltage control circuit 3 of the present working example includes A/D converter 31 for receiving voltage Vb of bias voltage supply 23 of read-out circuit 2 as an input voltage and converting voltage Vb into a digital signal, storage apparatus 32 for storing data to be used for outputting control voltage VDD corresponding to the value of voltage Vb of bias voltage supply 23, D/A converter 33 for converting data outputted from storage apparatus 32 into an analog value, and driver 34 for receiving an output voltage of D/A converter 33 as an input thereto and supplying control voltage VDD to first buffer 17, second buffer 18, third buffer 16 and the substrate of first P-channel MOSFET Q1 of semiconductor device 1.

Storage apparatus 32 receives digital data outputted from A/D converter 31, for example, as address data, reads out data recorded corresponding to the address in accordance with a lookup table system and outputs the data.

In order to record data into the storage apparatus 32, based on a characteristic (hereinafter referred to as 1/f noise coefficient characteristic) of 1/f noise coefficient K with respect to operating point Vop of semiconductor device 1 measured in advance, optimum control voltage VDD with which 1/f noise coefficient K is minimized at arbitrary operating point Vop is determined, and from the relationship among them, data of control voltage VDD corresponding to voltage Vb of bias voltage supply 23 corresponding to operating point Vop are recorded.

Since read-out circuit 2 such as described above is provided, also when it is tried to reduce 1/f noise of, for example, a semiconductor device which includes an element which is different from semiconductor device 1 of the present embodiment and has an impedance and a MOSFET, such reduction can be achieved by modifying the data of storage apparatus 32 or by replacing storage apparatus 32 with another storage apparatus in which modified data are stored.

Now, the principle of the noise reduction method for a semiconductor device of the present invention is described with reference to FIGS. 3 and 4.

Figure 3:
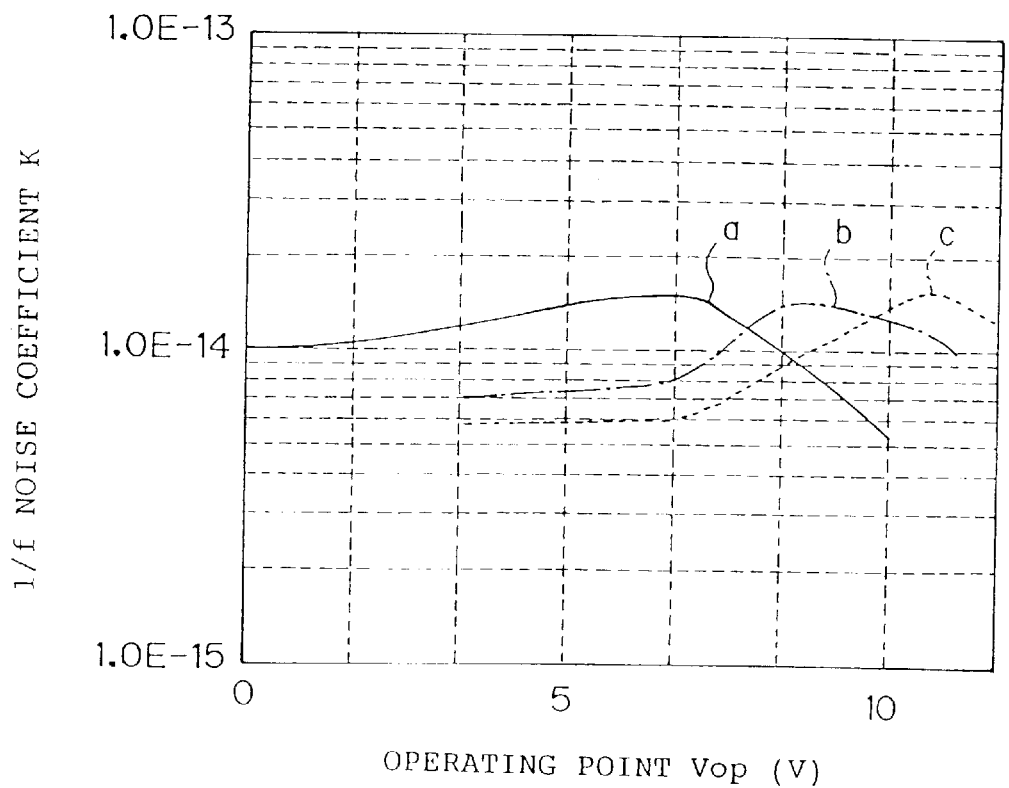
FIG. 3 is a graph illustrating a relationship of the 1/f noise coefficient to an operating point of the semiconductor device shown in FIG. 1.

Referring to FIG. 3, curves a, b and c illustrate characteristics when control voltage VDD is used as a parameter and varied to VDD=10, 13 and 15 [V], respectively. It is to be noted that FIG. 3 illustrates a graph produced based on actually measured values.

As seen from FIG. 3, 1/f noise coefficient K indicates a characteristic which relies upon operating point Vop and exhibits a maximum value at a predetermined operating point. If control voltage VDD is set to a higher voltage, then voltage Vopmax of an operating point at which 1/f noise coefficient K exhibits a maximum value is shifted to a higher voltage.

In FIG. 3, when VDD=10 [V], Vopmax=6.6 [V], when VDD=13 [V], Vopmax=8.6 [V], and when VDD=15 [V], Vopmax=10.5 [V].

From the relationships just mentioned, between voltage Vopmax [V] of an operating point at which 1/f noise coefficient K exhibits a maximum value and control voltage VDDpeak [V] then, there is a relationship given by $$Vopmax = \frac{4}{3 \cdot \left(\frac{Sp}{Sn}\right)} \cdot VDD\text{ peak} \quad (7)$$

where (Sp/Sn) is the ratio between current driving capacity Sp of P-channel MOSFET Q1 and current driving capacity Sn of N-channel MOSFET Q2 which form horizontal switch 14 of semiconductor device 1. It is to be noted that FIG. 3 illustrates a graph where (Sp/Sn)=2.

Accordingly, when operating point Vop of semiconductor device 1 is to be set, control voltage VDD is set so that it may be different from VDDpeak obtained based on expression (7).

It is to be noted that, where the voltage of the operating point is lower than Vopmax (on the left side of a peak of FIG. 3), the 1/f noise coefficient characteristic of semiconductor device 1 depends principally upon the 1/f noise coefficient characteristic of N-channel MOSFET Q2.

On the other hand, when the voltage of the operating point is higher than Vopmax (on the right side of a peak of FIG. 3), the 1/f noise coefficient characteristic of semiconductor device 1 depends principally upon the 1/f noise coefficient characteristic of P-channel MOSFET Q1.

By the way, as can be seen from FIG. 3, when semiconductor device 1 is rendered operative with the operating point set to a value lower than Vopmax (on the left side of a peak), in order to make 1/f noise coefficient K low, control voltage VDD should be set to a high value. However, with an actual MOSFET, since the voltage (=control voltage VDD) to be applied to the gate is limited to a value which depends upon the process of manufacture of the semiconductor device, the value of control voltage VDD is set to voltage VDDmax which depends upon the process of manufacture of the semiconductor device.

Meanwhile, when semiconductor device 1 is rendered operative with the operating point set to a value higher than Vopmax (on the right side of a peak), in order to make 1/f noise coefficient K low, control voltage VDD should be set to a low value. However, with an actual MOSFET, since, from the structure, control voltage VDD cannot be set lower than a source voltage (voltage Vop at the operating point) of the P-channel MOSFET, the control voltage and the operating point are set to a substantially equal voltage.

In summary, in order to allow semiconductor device 1 to operate with low 1/f noise coefficient K, the relationship between control voltage VDD and operating point Vop should be set such that VDD=VDDmax where Vop<4/{3×(Sp/Sn)}×VDDmax, but VDD=Vop where Vop≧4/{3×(Sp/Sn)}×VDDmax.

Since 1/f noise coefficient K of semiconductor device 1 is suppressed to a low value by setting control voltage VDD with respect to operating point Vop in this manner, an increase of 1/f noise when bias current Ib is increased is suppressed. Accordingly, an increase of signal component Is is allowed, and the S/N ratio can be improved.

That the method of setting 1/f noise coefficient K to a low value described above can be applied also to a case other than where (Sp/Sn)=2 has been confirmed by a circuit simulation conducted by the applicant of the present application.

It is to be noted that, where channel length Lp of a P-channel MOSFET and channel length Ln of an N-channel MOSFET are equal to each other, the ratio (Sp/Sn) between current driving capacities Sp and Sn is equal to the ratio (Wp/Sn) of channel width Wp of the P-channel MOSFET and channel width Wn of the N-channel MOSFET.

Now, that reduction of 1/f noise of the horizontal switch of semiconductor device 1 shown in FIG. 1 presents similar effects to those presented by reduction of 1/f noise of entire semiconductor device 1 is described with reference to FIG. 4.

Figure 4:
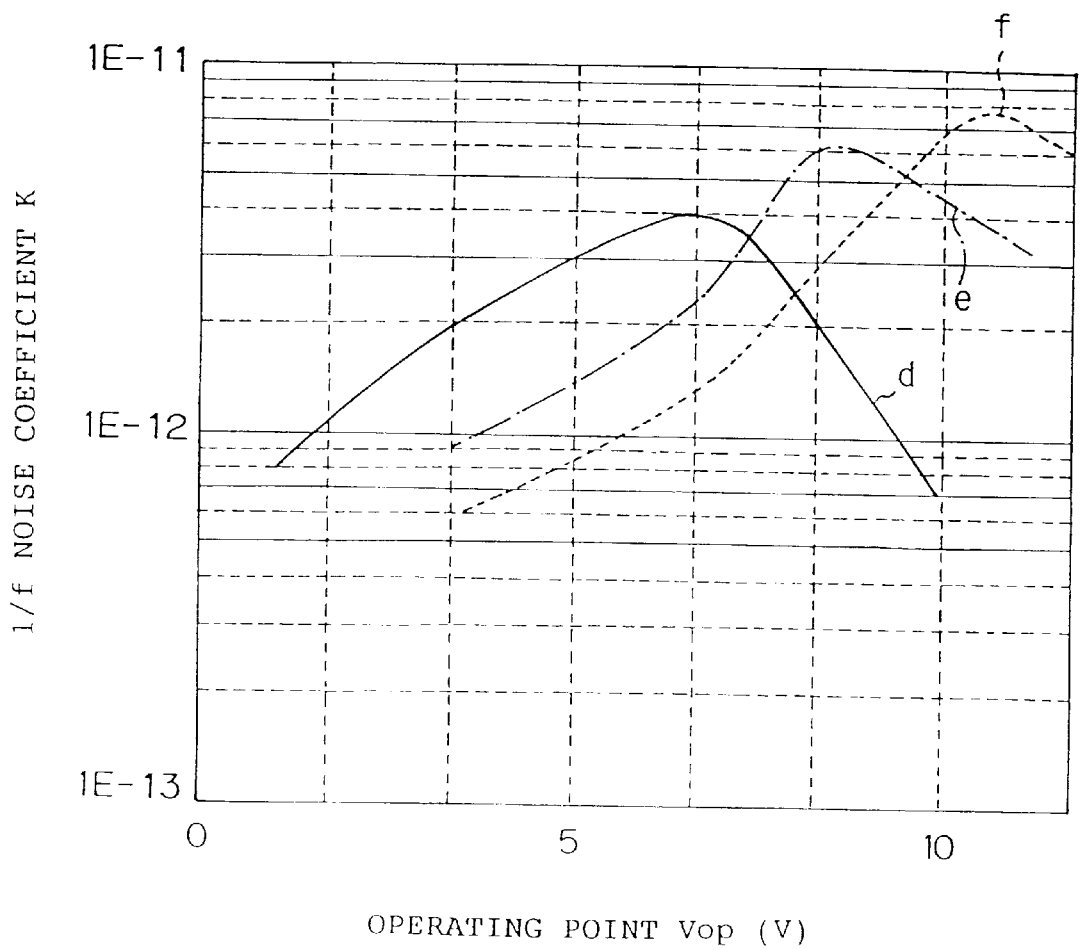
FIG. 4 is a graph illustrating a relationship of the 1/f noise coefficient to an operating point of a horizontal switch of the semiconductor device shown in FIG. 1.

Referring to FIG. 4, curves d, e and f indicate characteristics when, where control voltage VDD is used as a parameter, it is varied to VDD=10, 13 and 15 [V], respectively.

Comparing the graph of FIG. 4 with the graph of FIG. 3, the 1/f noise coefficient characteristics illustrated in FIG. 4 exhibit maximum values at the same operating points as those of FIG. 3. This arises from the fact that, since the resistance value of bolometer 11 is approximately 2.7 KΩ and is larger approximately by only one place than the resistance value of horizontal switch 14, the 1/f noise coefficient characteristic only of horizontal switch 14 has a significant influence on the 1/f noise coefficient characteristic of entire semiconductor device 1.

Accordingly, merely by suppressing the 1/f noise coefficient K of horizontal switch 14 of such semiconductor device 1 as shown in FIG. 1 to a low value, an equal effect to that obtained by suppressing the 1/f noise coefficient K of entire semiconductor device 1 to a low value is achieved.

It is to be noted that, while read-out circuit 2 of the present working example is described taking a construction wherein an integral waveform is outputted as an example, it may otherwise have another circuit construction wherein a variation in resistance of semiconductor device 1 is detected. In this instance, voltage control circuit 3 should detect the voltage at operating point Vop of semiconductor device 1 and output control voltage VDD corresponding to the detected voltage.

Further, while voltage control circuit 3 of the present working example detects base voltage Vb of transistor Q4 of read-out circuit 2 in place of operating point Vop, for example, a voltage detection circuit (not shown) which detects the emitter voltage of transistor Q4 may be used or else a current detection circuit (not shown) for detecting bias current Ib or the like may be used between the emitter of transistor Q4 and output terminal 15 of semiconductor device 1 instead.

Further, while, in the present working example, the construction of semiconductor device 1 is described in connection with a case wherein vertical switch 10, bolometer 11 and horizontal switch 14 are connected in series in this order from the ground side, also a different construction wherein they are connected in series in order of bolometer 11, vertical switch 10 and horizontal switch 14 or in order of bolometer 11, horizontal switch 14 and vertical switch 10 can be applied. Further, a further construction which does not employ vertical switch 10 and includes bolometer 11 and horizontal switch 14 connected in series in this order from ground potential Vss side can be applied.

Further, while the present working example is described in connection with an example constructed such that horizontal switch 14 is composed of first P-channel MOSFET Q1 and first N-channel MOSFET Q2 connected in parallel, also where it is otherwise composed only of first P-channel MOSFET Q1 or only of first N-channel MOSFET Q2, similar effects can be achieved by measuring the relationship of the 1/f noise coefficient to the operating point in advance and controlling the value of control voltage VDD based on the relationship.

Furthermore, while the present working example is described in connection with an example wherein semiconductor device 1 is an infrared sensor of the bolometer type, the present invention can be applied not only to bolometer 11 but also to an element which has an impedance and with which 1/f noise matters. In particular, the noise reduction method for a semiconductor device of the present invention can be applied to a semiconductor device which includes an element having an impedance and a MOSFET.

An example of such a semiconductor device as just described is an image sensor. With an image sensor, if a circuit or an equivalent circuit for an element (corresponding to one pixel) having a sensing function is formed in an equal construction to that of the present working example, then 1/f noise can be suppressed similarly as in the present working example.

Accordingly, the present invention can be applied to a two-dimensionally arranged semiconductor device, a one-dimensionally arranged semiconductor device, a semiconductor device composed of a single element and so forth. For example, the present invention can be applied to a semiconductor device wherein bolometers are arranged two-dimensionally and one horizontal switch is arranged for each column of the bolometers (refer to Japanese Patent Laid-Open No. 105794/96).

(Second Working Example)

In the following, a second working example of the first embodiment of the present invention is described with reference to the drawings. The present working example is different from the first working example in construction of the voltage control circuit. The other construction of the present working example is omitted here since it is similar to that of the first working example.

Figure 5:
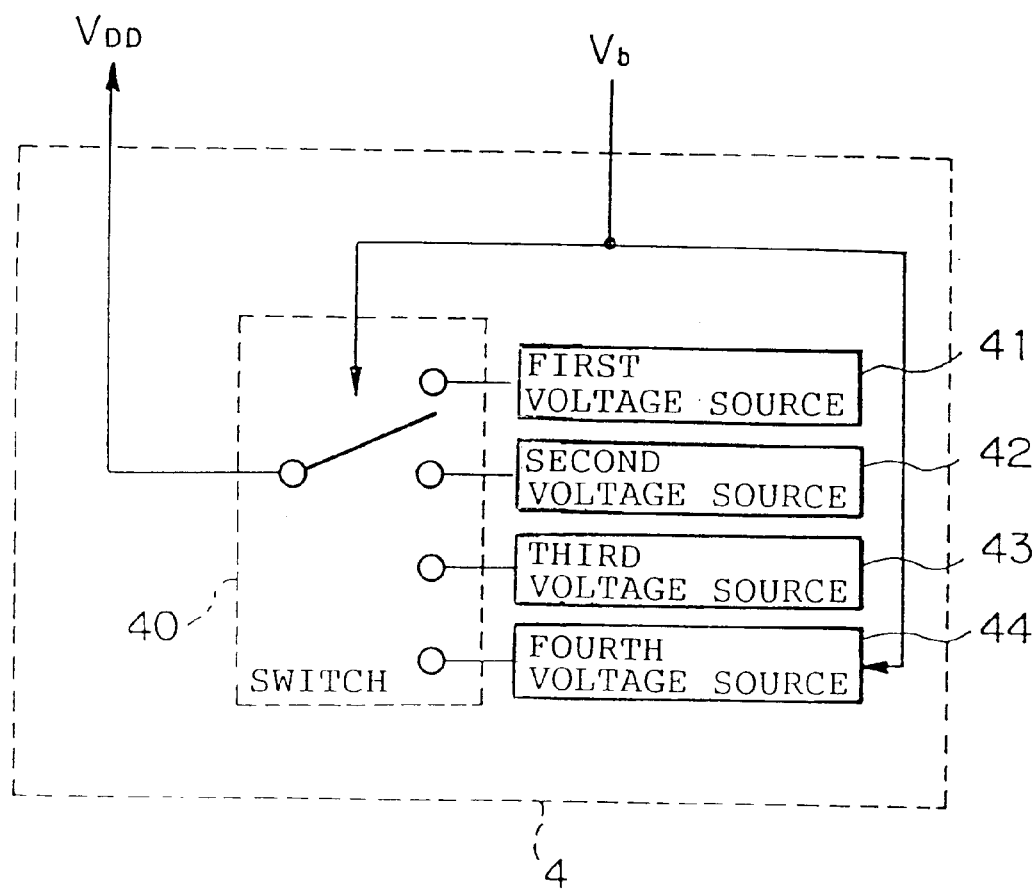
FIG. 5 is a block diagram showing a construction of a second working example of the voltage control circuit shown in FIG. 1.

Referring to FIG. 5, voltage control circuit 4 of the present working example includes first voltage source 41, second voltage source 42, third voltage source 43 and fourth voltage source 44 for out putting predetermined voltages in response to voltage Vb of a bias voltage source of a read-out circuit, and switch 40 which receives voltage Vb of the bias voltage source as an input thereto, selects one of terminals to which first to fourth voltage sources 41 to 44 are connected and outputs the voltage of the selected terminal as control voltage VDD.

In the construction described above, the output voltages of first voltage source 41, second voltage source 42 and third voltage source 43 are set to control voltages VDD set optimally from a 1/f noise coefficient characteristic (refer to FIGS. 3 and 4) of a semiconductor device measured in advance so that 1/f noise coefficient K may have minimum values in accordance with an operating point of the semiconductor device determined by voltage Vb of the bias voltage source of the read-out circuit.

It is to be noted that the output voltage of fourth voltage source 44 is set to a voltage equal to the voltage of operating point Vop.

Since such voltage control circuit 4 as described above is provided, optimum control voltage VDD corresponding to an operating point of the semiconductor device can be applied to the gate and the substrate of a MOSFET which forms the semiconductor device, and consequently, an increase of 1/f noise can be suppressed similarly as in the first working example.

It is to be noted that, while the present working example is described in connection with an example wherein four voltage sources are involved, the number of voltage sources need not be limited to 4, but a plural number of voltage sources may be provided in accordance with a situation of a circuit scale or the like.

Further, each of first to fourth voltage sources 41 to 44 may be formed from a simple circuit such as a voltage dividing circuit composed of resistors.

(Third Working Example)

Now, a third working example of the first embodiment of the present invention is described with reference to the drawings. The present working example is different from the first working example in construction of the semiconductor device. Since the other construction is similar to that of the first working example, description thereof is omitted here.

Figure 6:
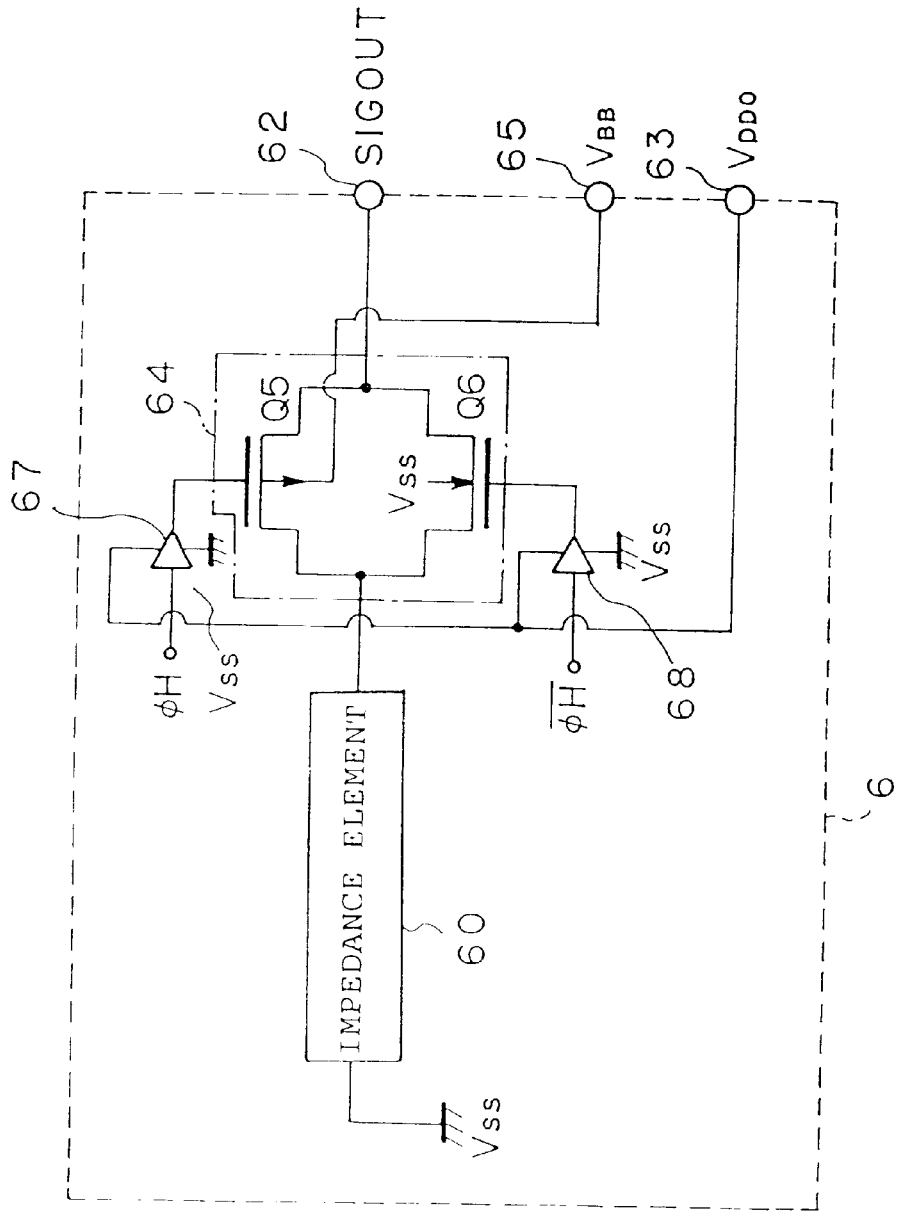
FIG. 6 is a block diagram showing a construction of a second working example of the semiconductor device shown in FIG. 1.

Referring to FIG. 6, semiconductor device 6 of the present embodiment include impedance element 60 having an impedance, and horizontal switch 64 composed of P-channel MOSFET Q5 and N-channel MOSFET Q6 connected in parallel. An end of impedance element 60 is connected to ground potential Vss. Meanwhile, an end of horizontal switch 64 is connected to the other end of impedance element 60, and the other end of horizontal switch 64 is connected to output terminal 62. The substrate of P-channel MOSFET Q5 is connected to first external terminal 65, and predetermined control voltage VBB is inputted from a voltage control circuit (refer to FIG. 1) to first external terminal 65. Meanwhile, the substrate of N-channel MOSFET Q6 is connected to ground potential Vss.

Further, first buffer 67 which outputs one of predetermined voltage VDD0 applied to a power supply terminal and ground potential Vss in response to horizontal switch selection signal φH is connected to the gate of P-channel MOSFET Q5 of horizontal switch 64 while second buffer 68 which outputs one of predetermined voltage VDD0 applied to the power supply terminal and ground potential Vss in response to a negated value of horizontal switch selection signal φH is connected to the gate of N-channel MOSFET Q6.

Power supply terminals of first buffer 67 and second buffer 68 are connected to second external terminal 63, and predetermined voltage VDD0 is inputted from the voltage control circuit or an external constant voltage circuit.

It is to be noted that impedance element 60 is a circuit composed of a plurality of elements such as, for example, a vertical switch or a bolometer described hereinabove in connection with the first working example.

In such a construction as described above, semiconductor device 6 of the present working example is characterized in that predetermined control voltage VBB can be applied independently to the substrate of P-channel MOSFET Q5 through first external terminal 65. As described above in connection with the first working example, control voltage VDD is normally applied to the substrate of P-channel MOSFET Q5.

Where such a construction as described above is employed, similar effects to those achieved by controlling the potential between the gate and the source (electrode connected to output terminal 62) of P-channel MOSFET Q5 by a substrate effect can be achieved by controlling voltage VBB to be applied to the substrate of P-channel MOSFET Q5.

Consequently, control of operating point Vop which determines the 1/f noise coefficient characteristic of P-channel MOSFET Q5 is equivalent to control of the potential between the gate and the source of P-channel MOSFET Q5, and the 1/f noise coefficient characteristic of P-channel MOSFET Q5 can be controlled by control voltage VBB to be applied to the substrate.

Accordingly, as described hereinabove in connection with the first working example, when semiconductor device 6 is rendered operative with the voltage of the operating point set to a value higher than Vopmax (on the right side of a peak of FIG. 3), since the 1/f noise coefficient characteristic of horizontal switch 64 depends principally upon the 1/f noise coefficient characteristic of P-channel MOSFET Q5, the 1/f noise coefficient characteristic of horizontal switch 64 can be controlled by control voltage VBB to be applied to first external terminal 65.

It is to be noted that, in this instance, since the voltage to be applied to second external terminal 63 does not have an influence on the 1/f noise coefficient characteristic of horizontal switch 64, predetermined voltage VDD0 is applied to second external terminal 63.

Consequently, by setting voltage VBB to be applied to first external terminal 65 to a voltage lower than control voltage VDD to be applied to the gate of N-channel MOSFET Q6 and preferably equal to operating point Vop, an increase of 1/f noise of semiconductor device 6 can be suppressed similarly as in the first working example.

Further, since the voltage control circuit is required to apply voltage VBB only to the substrate of P-channel MOSFET Q5 which has an influence on the 1/f noise coefficient characteristic, optimization of the driving capacity of a driver circuit and so forth in the voltage control circuit is allowed.

(Fourth Working Example)

In the following, a fourth working example of the first embodiment of the present invention is described with reference to the drawings.

Figure 7:
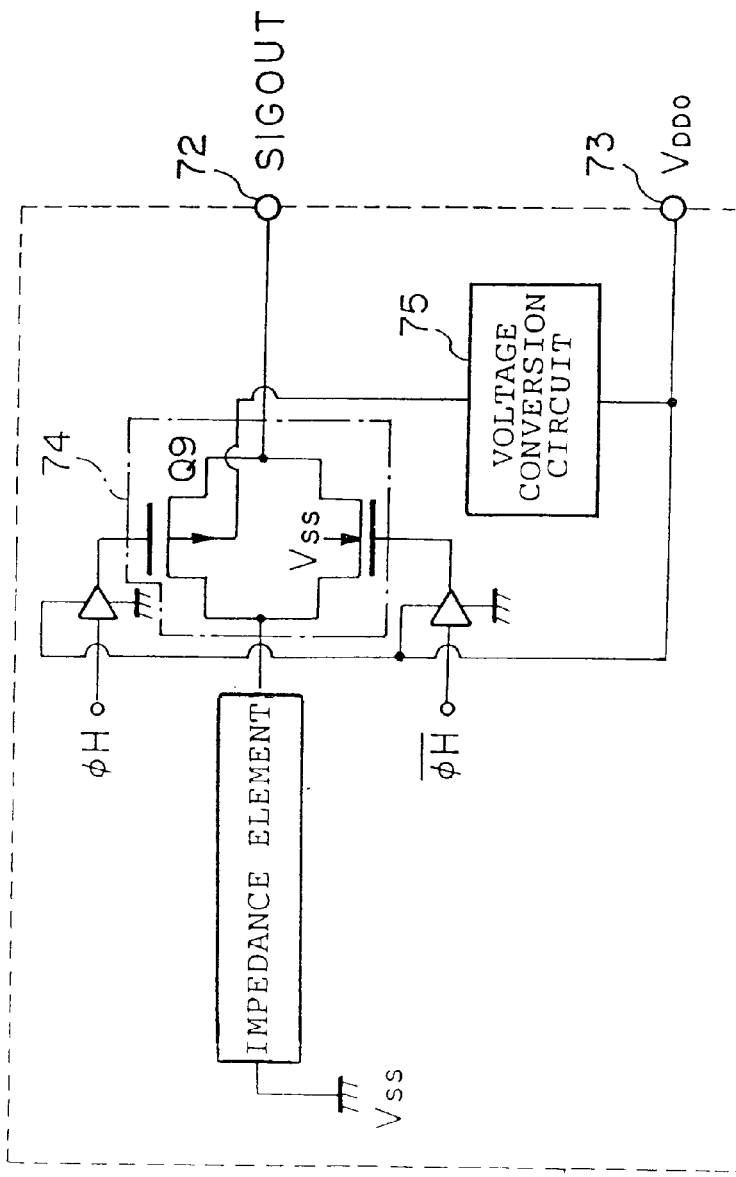
FIG. 7 is a block diagram showing a construction of a third working example of the semiconductor device shown in FIG. 1.

Semiconductor device 7 of the present working example is different from the third working example in that, as seen in FIG. 7, it includes voltage conversion circuit 75 for applying control voltage VBB to the substrate of P-channel MOSFET Q7 which forms horizontal switch 74. Since the other construction is similar to that of the third working example, description thereof is omitted here.

Referring to FIG. 7, voltage conversion circuit 75 in the present working example converts predetermined voltage VDD0 inputted thereto from external terminal 73 into voltage VBB and applies voltage VBB to the substrate of P-channel MOSFET Q7. By controlling voltage VBB to be applied to the substrate of P-channel MOSFET Q7 by voltage conversion circuit 75 in this manner, an increase of 1/f noise can be suppressed similarly as in the third working example.

Further, since voltage conversion circuit 75 is provided in semiconductor device 7, the first external terminal described in connection with the third working example is not required, and the area required for a pad or a wiring line in the semiconductor device can be eliminated.

Furthermore, since it is required to apply, in addition to an operating point, only predetermined voltage VDD0 to semiconductor device 7, semiconductor device 7 has a good operability.

Further, since only predetermined voltage VDD0 is required to be applied to the external terminal, an external circuit for supplying voltage VDD0 can be implemented with a variable voltage circuit or the like, and the circuit construction is simplified.

It is to be noted that, while voltage conversion circuit 75 of the present working example has a circuit construction which generates voltage VBB in response to an input of predetermined voltage VDD0, another circuit construction wherein the voltage of operating point Vop is detected by a detection circuit provided outside semiconductor device 7 and is inputted to voltage conversion circuit 75 to generate voltage VBB may be employed.

Alternatively, a different circuit construction wherein the voltage of output terminal 72 is detected in the inside of semiconductor device 7 and inputted to voltage conversion circuit 75 to generate predetermined control voltage VBB may be employed.

As described above, by measuring a 1/f noise coefficient characteristic of a semiconductor device in advance and applying, to a MOSFET of the semiconductor device, control voltage VDD with which 1/f noise coefficient K of the semiconductor device has a low value in response to operating point Vop of the semiconductor device from the measured characteristic, an increase of 1/f noise can be suppressed also when bias current Ib is increased. Accordingly, an increase of the signal component is allowed and the S/N ratio can be improved.

In this instance, similar effects can be achieved even if control voltage VDD is applied only to the MOSFET which has a significant influence on 1/f noise of the entire semiconductor device.

Further, since a special material for improving the S/N ratio need not be used and the structure of an element is not complicated, the time and the cost required for development of an element are not required, and the production cost is reduced.

(Second Embodiment)

In the following, a second embodiment of the noise reduction method for a semiconductor device of the present invention is described with reference to the drawings.

The second embodiment provides a method which reduces 1/f noise of a semiconductor device by setting element dimensions (channel length L and channel width W) of a MOSFET which is a component of the semiconductor device so that the 1/f noise coefficient may be minimized. It is to be noted that, since the constructions of the semiconductor device, read-out circuit and voltage control circuit are similar to those in the first embodiment, description thereof is omitted here.

The 1/f noise coefficient (refer to FIG. 4) of the semiconductor device is composed of 1/f noise coefficients of individual components as recognized from expression (12) given hereinbelow.

Particularly, the 1/f noise of the horizontal switch has the most significant influence on the magnitude of 1/f noise of the semiconductor device due to the facts that the horizontal switch is formed from a MOSFET which is reputed to be high in 1/f noise and that a variation of the operating point varies the resistance value.

This can be recognized from the fact that, of the 1/f noise coefficient characteristic illustrated in FIG. 4 (1/f noise coefficient characteristic with respect to the operating point where only the horizontal switch is involved), the operating point at which the 1/f noise coefficient exhibits a maximum value and, of the 1/f noise coefficient characteristic illustrated in FIG. 3 (1/f noise coefficient characteristic with respect to the operating point of the semiconductor device), the operating point at which the 1/f noise coefficient characteristic exhibits a maximum value, have an equal voltage. Accordingly, in order to reduce the 1/f noise of the semiconductor device, it is effective to reduce the 1/f noise of the horizontal switch.

It is to be noted that, in the following description, for simplified description, it is assumed that channel length Lp of the P-channel MOSFET and channel length Ln of the N-channel MOSFET are individually fixed to predetermined values (Lp0 and Ln0) and the total channel width of the P-channel MOSFET and the N-channel MOSFET is fixed to 600 $\mu$m (Wp+Wn=600 $\mu$m). Further, control voltage VDD is fixed to 13 [V].

Usually, since a MOSFET has a lower resistance and exhibits a higher current driving capacity as the ratio (W/L) of channel length W to channel width L decreases, this is preferable as a characteristic of an element.

Therefore, taking characteristics of an element such as a layout area and channel length modulation, design rules and other necessary conditions into consideration, usually channel length L is set short and channel width W is set large.

Consequently, here, channel length L is set to a value as low as possible within a range which can be realized based on design rules. Further, since channel width W is limited by the layout area of an element and so forth, here the total value of channel widths W is fixed, and as an example, it is set to 600 $\mu$m (Wp+Wn=600 $\mu$m).

In the following, a method of optimizing channel widths Wp and Wn and channel lengths Lp and Ln of the P-channel MOSFET and the N-channel MOSFET which compose the horizontal switch so that the 1/f noise coefficients of them may be minimized is described with reference to a flow chart of FIG. 8.

Figure 8:
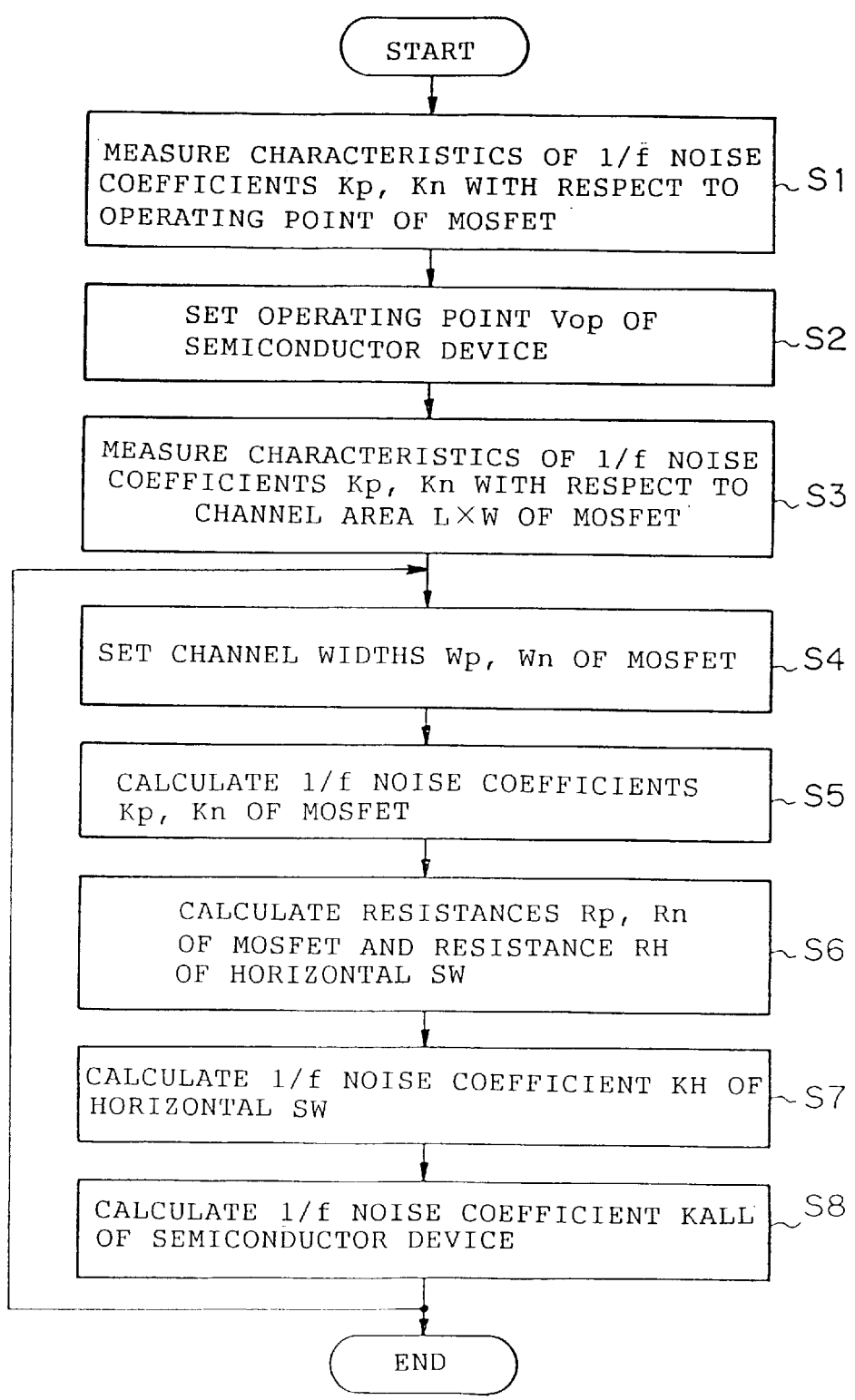
FIG. 8 is a flow chart illustrating a procedure of a second embodiment of the noise reduction method for a semiconductor device of the present invention.

Referring to FIG. 8, first in step S1, a temporary horizontal switch is formed using a P-channel MOSFET and an N-channel MOSFET having known element dimensions, and the relationship of the 1/f noise coefficient to the operating point of each of the P-channel MOSFET and the N-channel MOSFET is measured.

In this instance, the control voltage to the horizontal switch composed of the MOSFETs having known element dimensions is set to a voltage equal to control voltage VDD of a semiconductor device to be designed (here, VDD=13 [V]). It is to be noted that the channel width of the P-channel MOSFET having known element dimensions is represented by Wp0, the channel length by Lp0, the channel width of the N-channel MOSFET by Wn0, and the channel length by Ln.

Figure 9:
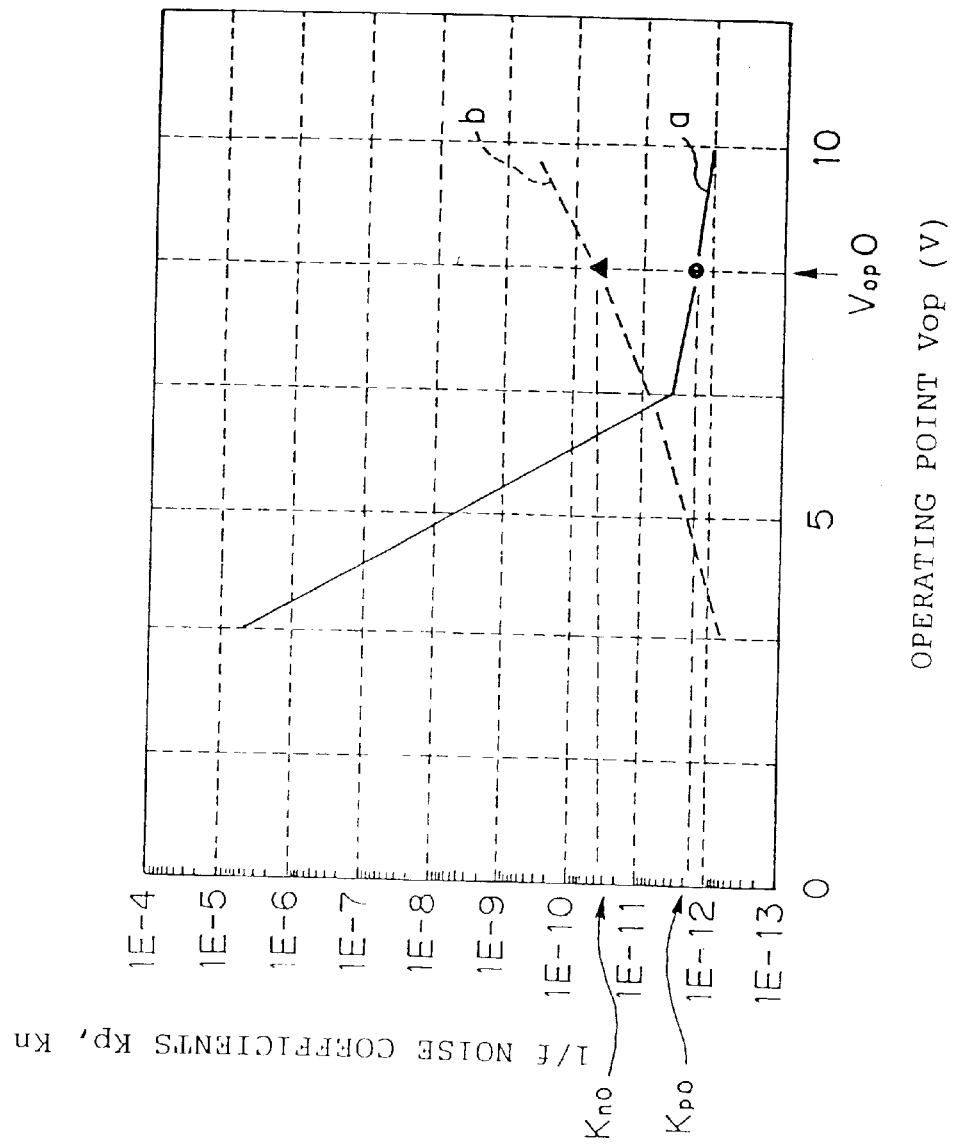
FIG. 9 is a graph illustrating a relationship of the 1/f noise coefficient to operating points of a P-channel MOSFET and an N-channel MOSFET which form the horizontal switch and have known element dimensions.

FIG. 9 illustrates relationships of the 1/f noise coefficients to the operating points of the P-channel MOSFET and the N-channel MOSFET which compose the horizontal switch and have known element dimensions. It is to be noted that curve a in FIG. 9 indicates the 1/f noise coefficient characteristic of the P-channel MOSFET while curve b indicates the 1/f noise coefficient characteristic of the N-channel MOSFET.

As can be seen from FIG. 9, 1/f noise coefficient (curve a) Kp of the P-channel MOSFET exhibits a tendency in which it decreases as operating point Vop increases (because the ON resistance of the P-channel MOSFET decreases). Meanwhile, 1/f noise coefficient characteristic (curve b) Kn of the N-channel MOSFET exhibits another tendency in which it increases as operating point Vop increases (because the resistance of the N-channel MOSFET increases).

Then, in step S2, from the 1/f noise coefficient characteristics of the P-channel MOSFET and the N-channel MOSFET, which have known element dimensions, measured in step S1 (refer to FIG. 9), the 1/f noise coefficient at an operating point of the semiconductor device to be designed is calculated.

From FIG. 9, it can be seen that, when the operating point is set to Vop0 (=8.3 [V]), the 1/f noise coefficient of the P-channel MOSFET is determined to be Kp0 and the 1/f noise coefficient of the N-channel MOSFET is determined to be Kn0.

Then, in step S3, relationships of the 1/f noise coefficients to channel areas L×W of the P-channel MOSFET and the N-channel MOSFET which are components of the semiconductor device to be designed are calculated.

Figure 10:
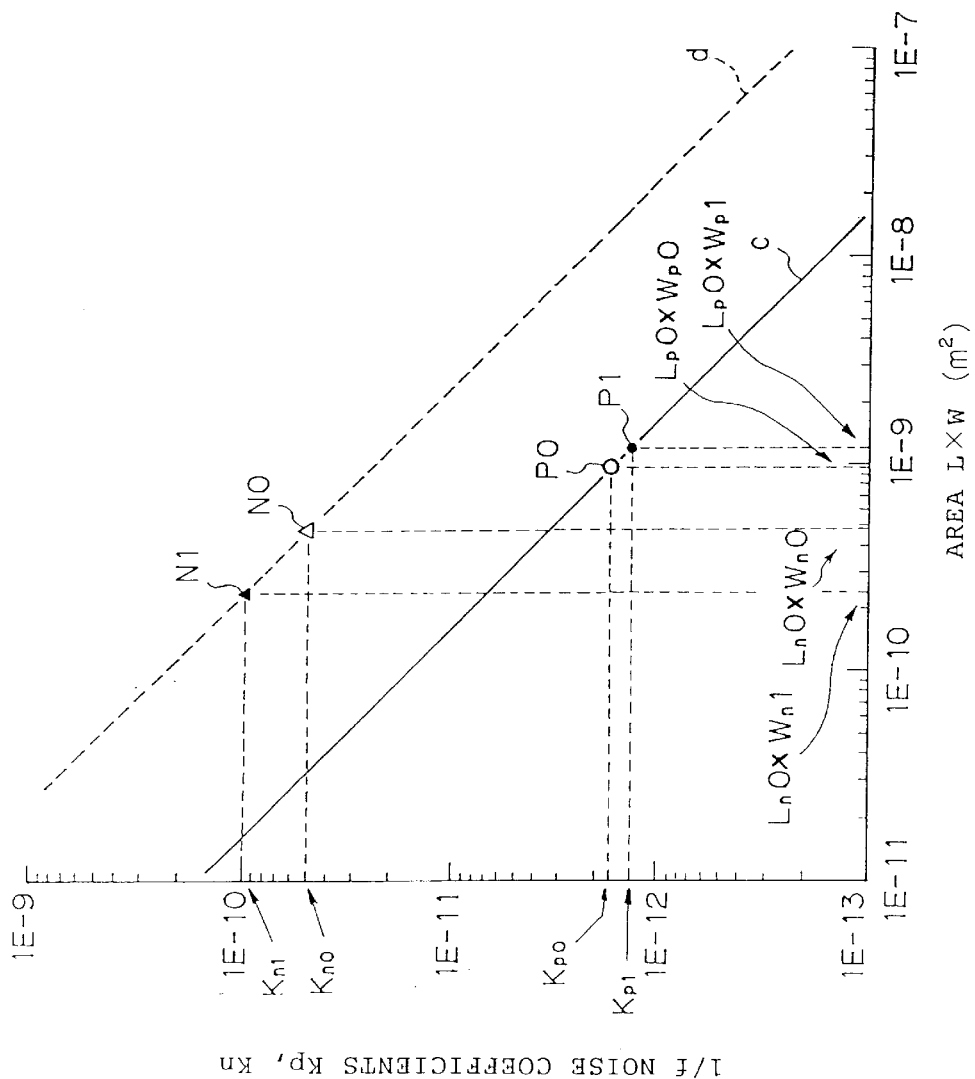
FIG. 10 is a graph illustrating a relationship of the 1/f noise component to the channel area of a MOSFET.

FIG. 10 illustrates the relationships of the 1/f noise coefficients to the channel areas of the MOSFETs. It is to be noted that curve c in FIG. 10 indicates the characteristic of 1/f noise coefficient Kp to channel area Lp×Wp of the P-channel MOSFET while curve d indicates the characteristic of 1/f noise coefficient Kn to channel area Ln×Wn of the N-channel MOSFET. Determination of those two curves c and d is described below.

First, channel area Lp0×Wp0 of the P-channel MOSFET and channel area Ln0×Wn0 of the N-channel MOSFET which have been used in step S1 and have known element dimensions are calculated.

Then, from channel area Lp0×Wp0 and 1/f noise coefficient Kp0 of the P-channel MOSFET calculated in step S2, point P0 on the graph is determined. Similarly, from channel area Ln0×Wn0 and 1/f noise coefficient Kn0 of the N-channel MOSFET calculated in step S2, point N0 on the graph is determined.

Thereafter, the gradients of curves c and d are determined. It is generally known that the 1/f noise coefficient of a MOSFET increases in proportion to channel area L×W to the mth power ($-1.5 \leq m \leq -0.5$). It is to be noted that FIG. 10 illustrates the curves where m=−1.

Accordingly, curves c and d are straight lines which pass point P0 and point N0, respectively, and have a predetermined gradient given by m=−1.

It is to be noted that, where the operating point is not Vop0, since the values of 1/f noise coefficient Kp of the P-channel MOSFET and 1/f noise component Kn of the N-channel MOSFET are individually different as seen in FIG. 9, the characteristics of 1/f noise coefficients K with respect to channel areas L×W are drawn as curves having different intercepts from those of curves c and d shown in FIG. 10.

Here, the value of m may be determined measuring the 1/f noise coefficient characteristic of a different MOSFET which has different channel area L×M but has known element dimensions.

Then, in step S4, the channel widths of the P-channel MOSFET and the N-channel MOSFET of the semiconductor device to be designed are set to arbitrary values Wp1 and Wn1 (here, Wp1+Wn1=600 μm), respectively.

Then, in step S5, channel area Lp0×Wp1 and channel area Lp1×Wp0 for channel width Wp1 of the P-channel MOSFET and channel width Wn1 of the N-channel MOSFET set in step S4 are calculated, and point P1 and point N1 are calculated from the characteristics of the 1/f noise coefficient with respect to the channel area illustrated in FIG. 10 are calculated, whereafter 1/f noise coefficients Kp1 and Kn1 then are calculated.

Thereafter, in step S6, where the channel width of the P-channel MOSFET to be designed is represented by Wp1 and the channel width of the N-channel MOSFET by Wn1, resistance Rp1 of the P-channel MOSFET, resistance Rn1 of the N-channel MOSFET and resistance RH of the horizontal switch are calculated.

Resistance Rp of the P-channel MOSFET is calculated based on the following expressions known popularly with various corrections performed thereto so that it may coincide with an actual device characteristic:

$$Rp = \frac{\Delta Vds}{\Delta Id} = \frac{1}{(Wp/Lp) \cdot \mu p \cdot C0 \cdot \{(Vgs - Vth) - Vds\}} \quad (8)$$

$$Vth = 2\phi f + VFB + \frac{\{2 \cdot \varepsilon k \cdot \varepsilon 0 \cdot q \cdot Na \cdot (2\phi f + Vbs)\}^{1/2}}{C0} \quad (9)$$

where Vds is the source-drain voltage, Id is the drain current, Wp is the channel width, Lp is the channel length, μp is the mobility of holes in the channel, C0 is the gate capacitance, Vgs is the gate-source voltage, Vth is the threshold voltage, φf is the Fermi potential difference, Vfb is the flat band voltage, εk is the dielectric constant, ε0 is the dielectric constant of the vacuum, q is the charge quantity of an electron, Na is the ionized acceptor concentration, and Vbs is the substrate-source voltage.

Also resistance Rn of the N-channel MOSFET is calculated similarly replacing the constants in expressions (8) and (9) with constants peculiar to the N-channel MOSFET.

Further, resistance RH of the horizontal switch is calculated in accordance with the following expression:

RH=Rp×Rn/(Rp+Rn)  (10)

Figure 11:
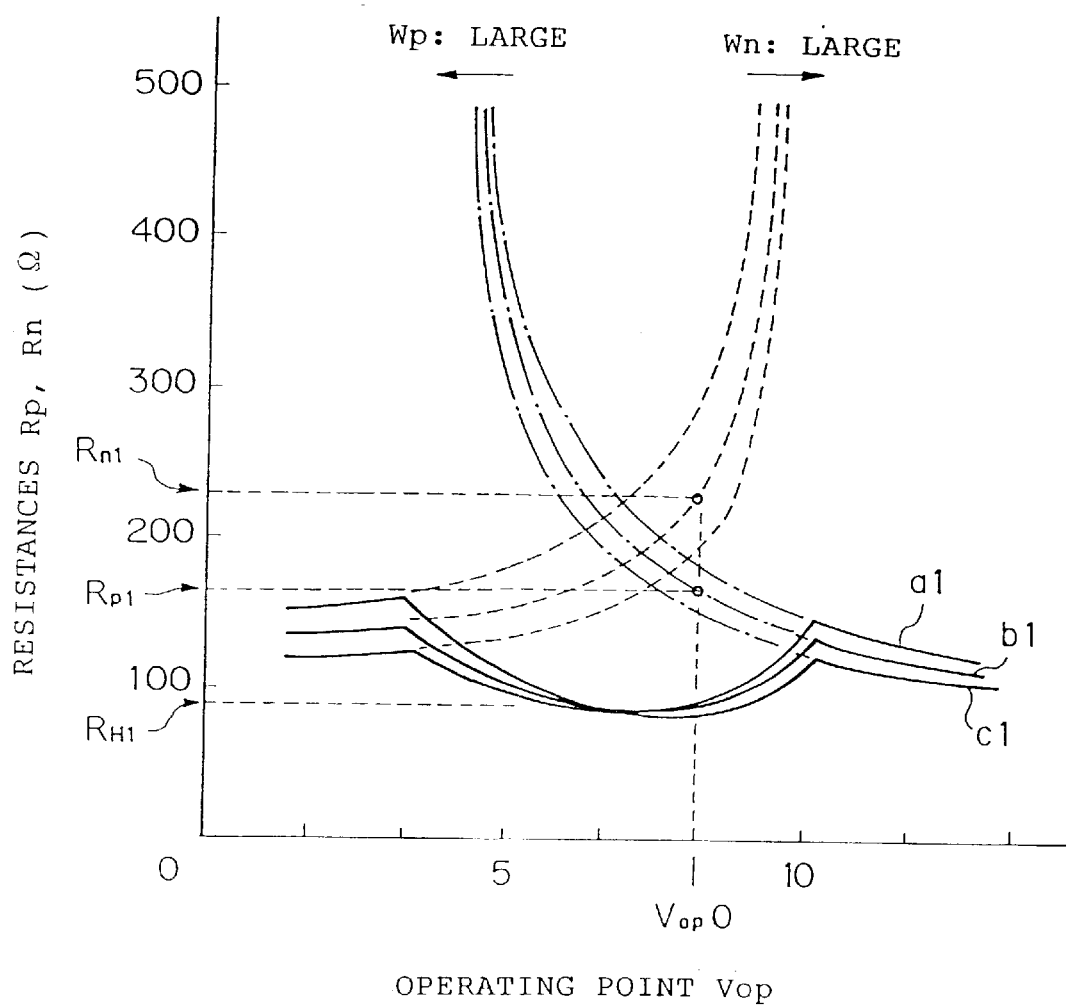
FIG. 11 is a graph illustrating relationships of the resistance value of the P-channel MOSFET, the resistance value of the N-channel MOSFET and the resistance value of the horizontal switch to an operating point.

FIG. 11 illustrate an example of characteristics of resistance Rp of the P-channel MOSFET at operating point Vop, resistance Rn of the N-channel MOSFET and resistance Rh of the horizontal switch where channel width Wp of the P-channel MOSFET and channel width Wn of the N-channel MOSFET are used as parameters.

Curves a1, b1 and c1 in FIG. 11 indicate characteristics of resistance RH of the horizontal switch and characteristics where the ratio of channel width Wp of the P-channel MOSFET/channel width Wn of the N-channel MOSFET is set to 400/200, 450/150 and 500/100 (the units are Wp [μm]/Wn [μm]). It is to be noted that, in FIG. 11, the characteristics of resistance Rp of the P-channel MOSFET are indicated by alternate long and short dash lines and the characteristics of resistance Rn of the N-channel MOSFET are indicated by broken lines.

From FIG. 11, it can be seen that, as channel width Wp of the P-channel MOSFET increases, resistance Rp of the P-channel MOSFET decreases, but as channel width Wn of the N-channel MOSFET increases, resistance Rn of the N-channel MOSFET decreases.

Further, resistance values RH of the horizontal switch exhibit a reversal in magnitude at a boundary in the proximity of operating point Vop=7.6 [V].

In particular, where operating point Vop is lower than 7.6 [V], curve a1<b1<c1, and as channel width Wp of the P-channel MOSFET increases, resistance value RH of the horizontal switch increases. On the other hand, where operating point Vop is equal to or higher than 7.6 [V], curve c1<b1<a1, and as channel width Wp of the P-channel MOSFET increases, resistance value RH of the horizontal switch decreases.

It is to be noted that FIG. 11 additionally indicates resistance Rp1 of the P-channel MOSFET, resistance Rn1 of the N-channel MOSFET and resistance RH1 of the horizontal switch where the channel width of the P-channel MOSFET is Wp1 and the channel width of the N-channel MOSFET is Wn1.

Then, in step S7, 1/f noise coefficient KH of the horizontal switch is calculated in accordance with the following expression:

$$KH = \frac{Kp \cdot Rn^2 Kn \cdot Rp^2}{(Rp + Rn)^2} \quad (11)$$

where Kp is the 1/f noise coefficient of the P-channel MOSFET, Rp the resistance value of the P-channel MOSFET, Kn the 1/f noise coefficient of the N-channel MOSFET, and Rn the resistance value of the N-channel MOSFET.

Since the horizontal switch is formed from a P-channel MOSFET and an N-channel MOSFET connected in parallel, 1/f noise coefficient Kp of the P-channel MOSFET and 1/f noise coefficient Kn of the N-channel MOSFET are multiplied by the squares of the resistance values of the other MOSFETs as weights, respectively, as seen from expression (12).

Figure 12:
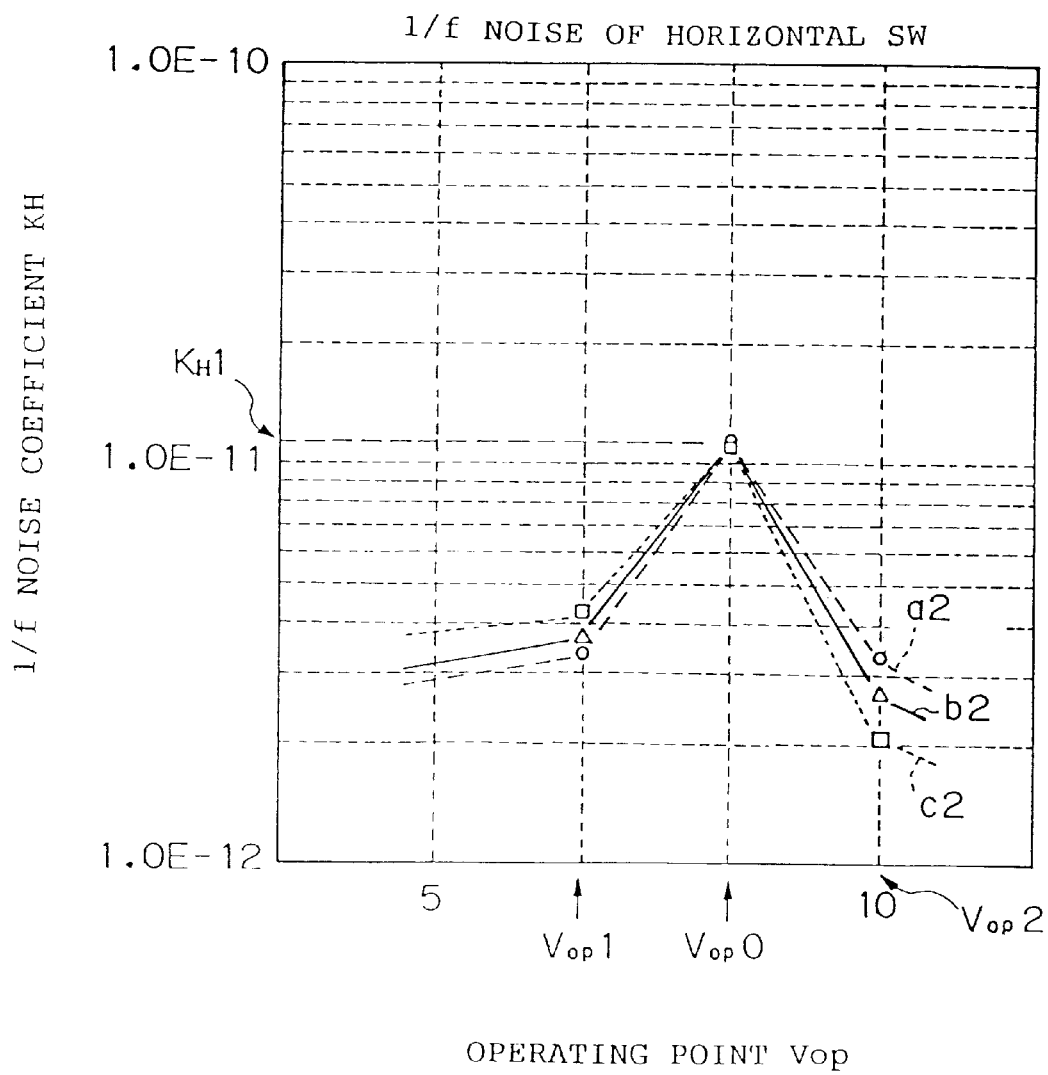
FIG. 12 is a graph illustrating a relationship of the 1/f noise coefficient to an operating point of the horizontal switch.

FIG. 12 illustrates relationships of 1/f noise coefficients to operating points of the horizontal switch. In FIG. 12, relationships of 1/f noise coefficient KH to an operating point of the horizontal switch where channel width Wp of the P-channel MOSFET and channel width Wn of the N-channel MOSFET are used parameters, and curves a2, b2 and c2 indicate characteristics where channel width Wp of the P-channel MOSFET and channel width Wn of the N-channel MOSFET are set to Wp/Wn=400/200, 450/150 and 500/100, respectively.

Here, 1/f noise coefficients Kp1 and Kn1 and resistance values Rp1 and Rn1 obtained by the processing in the steps up to step S6 are substituted into expression (11) to calculate 1/f noise coefficient KH1 only of the horizontal switch.

It is to be noted that 1/f noise coefficient KH of the horizontal switch at any other operating point than Vop0 is a value obtained by calculating 1/f noise coefficients Kp and Kn for each operating point from the characteristic (FIG. 9) measured in step S1 and performing the processing in steps S2 to S6 using thus calculated 1/f noise coefficients Kp and Kn.

As seen from FIG. 12, where the operating point is at Vop0 (=8.3 [V]), even if the channel widths of the MOSFETs vary, little difference appears with 1/f noise coefficient KH of the horizontal switch.

On the other hand, where the operating point is at Vop1 (=6.6 [V]), the magnitude of 1/f noise coefficient KH of the horizontal switch exhibits the relationship of curve a2<b2<c2, but where the operating point is at Vop2 (=10 [V]), the magnitude of 1/f noise coefficient KH of the horizontal Sw exhibits the relationship of curve c2<b2<a2.

Thereafter, in step S8, 1/f noise coefficient KALL of the entire semiconductor device is calculated in accordance with the following expression:

$$KALL = \frac{KV \cdot RV^2 + KB \cdot RB^2 + KH \cdot RH^2}{(RV + RB + RH)^2} \quad (12)$$

where KV, KB and KH are the 1/f noise coefficients of the vertical switch, bolometer and horizontal switch, respectively, and RV, RB and RH are the resistance values of the vertical switch, bolometer and horizontal switch, respectively. It is to be noted that KV, KB, RV and RB are values measured in advance, and KH and RH are values calculated in the processing up to step S7. Further, while expression (12) indicates 1/f noise coefficient KALL of the entire semiconductor device where the semiconductor device is composed of a vertical switch, a bolometer and a horizontal switch connected in series, where the semiconductor device is composed otherwise of a plurality of elements connected in series and each having an impedance and a MOSFET circuit (for example, a horizontal switch) including a MOSFET, 1/f noise coefficient KALL of the entire semiconductor device is calculated in accordance with $$KALL = \frac{KH1 \cdot RH1^2 + K_1 \cdot R_1^2 + K_2 \cdot R_2^2 + \ldots + K_N \cdot R_N^2}{(RH1 + R_1 + R_2 + \ldots + R_N)^2}$$

where KH1 is the 1/f noise coefficient of the MOSFET circuit, RH1 is the resistance value of the MOSFET circuit, Ki (i=positive numbers of 1 to N) are the 1/f noise coefficients of the elements each having an impedance, and Ri (i=positive numbers of 1 to N) are the resistance values of the elements each having an impedance.

In a semiconductor device such as shown in FIG. 1, since a vertical switch, a bolometer and a horizontal switch are connected in series, each of the 1/f noise coefficients is multiplied by the square of a resistance as a weight as seen from expression (12). Therefore, if the resistance is low, then even if the 1/f noise coefficient is high, the influence upon the 1/f noise of entire semiconductor device 1 is little.

By the processing in step S8, 1/f noise coefficient KALL of the entire semiconductor device with respect to channel lengths L and channel widths W of the MOSFETs is determined.

Figure 13:
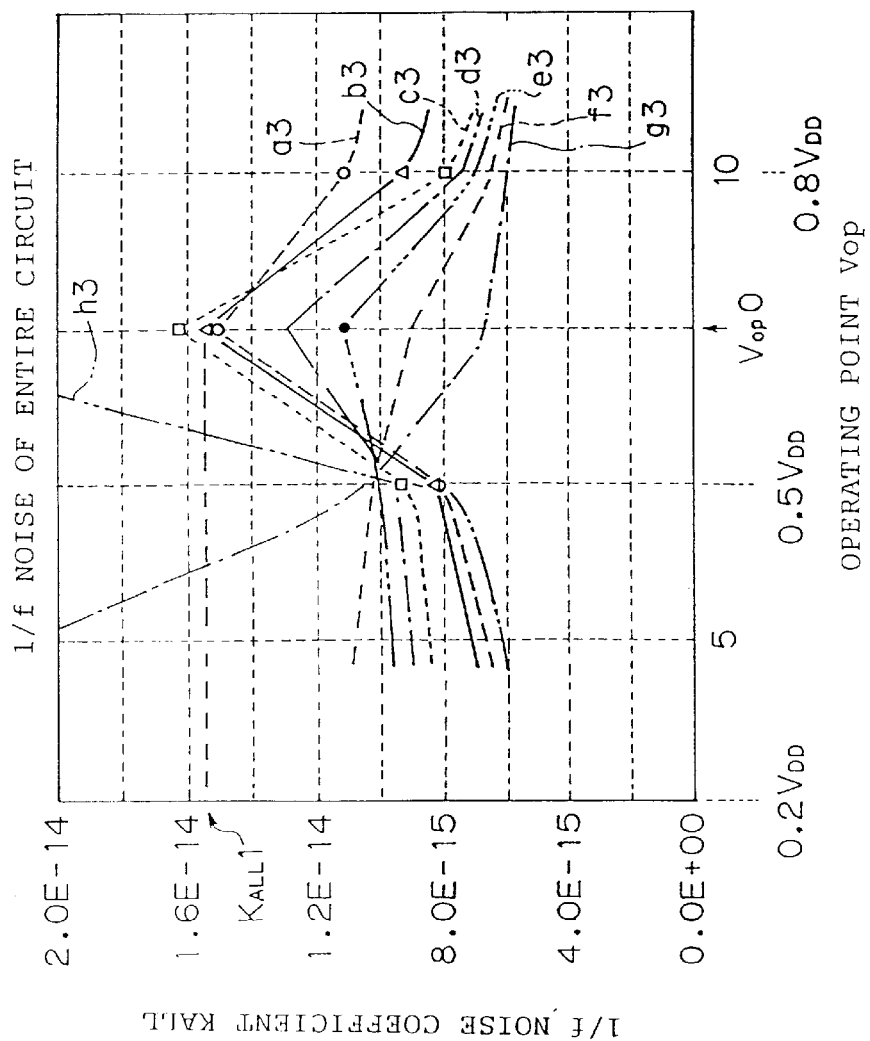
FIG. 13 is a graph illustrating a relationship of the 1/f noise coefficient to an operating point of the semiconductor device when channel width Wp of the P-channel MOSFET and channel width Wn of the N-channel MOSFET are used as parameters.

FIG. 13 is a graph illustrating relationships of the 1/f noise coefficient to the operating point of the semiconductor device where channel width Wp of the P-channel MOSFET and channel width Wn of the N-channel MOSFET are used as parameters.

Curves a3, b3, c3, d3, e3, f3, g3 and h3 of FIG. 13 indicate characteristics where channel width Wp of the P-channel MOSFET and channel width Wn of the N-channel MOSFET are set to Wp/Wn=400/200, 450/150, 500/100, 525/75, 550/50, 575/25, 600/0 and 0/600, respectively.

It is to be noted that curve g3 indicates a characteristic where the horizontal switch is composed only of a P-channel MOSFET, and curve h3 indicates a characteristic where the horizontal switch is composed only of an N-channel MOSFET.

From FIG. 13, it can be seen that, as the operating point varies, the relationship in magnitude between channel widths Wp/Wn of the MOSFETs and 1/f noise coefficient KH.

1/f noise coefficient KALL1 of the entire semiconductor device can be obtained by substituting resistance value RH1 and 1/f noise coefficient KH1 of the horizontal switch calculated in steps S6 and S7 into expression (12).

Further, channel width Wp of the P-channel MOSFET and channel width Wn of the N-channel MOSFET are varied, and then the control returns to the processing of step S4 to repetitively and successively perform the processing in the steps up to step S8.

By executing processing in accordance with the flow chart described above, channel lengths and channel widths of the MOSFETs with which 1/f noise coefficient KALL of semiconductor device 1 is minimized with respect to an operating point of the semiconductor device can be determined.

It is to be noted that, while a case wherein channel length Lp of the P-channel MOSFET and channel length Ln of the N-channel MOSFET are fixed is described here, the channel widths and the channel lengths of the MOSFETs can be optimized by setting channel lengths Lp and Ln simultaneously with the setting of channel widths Wp and Wn.

Meanwhile, where a semiconductor device does not include a vertical switch, calculation should be performed with KV and RV of expression (12) set to zero (0).

Further, while a horizontal switch which includes a P-channel MOSFET and an N-channel MOSFET connected in parallel is described as an example here, the application of the present invention is not limited to such a construction as just described, but the present invention may be applied to various circuits which includes a MOSFET.

Consequently, by applying dimension optimization of a MOSFET described above to a semiconductor device which is composed of an element having an impedance and a MOSFET, the 1/f noise coefficient can be minimized, and an increase of 1/f noise can be prevented.

Now, an example of a result of optimization of channel width Wp of the P-channel MOSFET and channel width Wn of the N-channel MOSFET by the processing described above is described.

Where channel length Lp of the P-channel MOSFET and channel length Ln of the N-channel MOSFET are fixed (Lp=Ln=2.4 [$\mu$m]) and the sum of the channel widths of the P-channel MOSFET and the N-channel MOSFET is 600 [$\mu$m] (Wp+Wn=600 [$\mu$m]), a preferable range of the ratio (Wp/Wn) between the channel widths of the MOSFETs to operating point Vop can be determined as described in (1) to (4) below:

(1) Where Vop$\leq$0.5×VDD, the ratio (Wp/Wn) between the channel widths of the P-channel MOSFET and the N-channel MOSFET is set to approximately 0/600$\leq$(Wp/Wn)$\leq$500/100.

The reason is that, as seen in FIG. 13, where the operating point is Vop$\leq$0.5×VDD, the 1/f noise coefficient exhibits a minimum value at (Wp/Wn)=0/600. Further, where 0/600$\leq$(Wp/Wn)$\leq$500/100, the 1/f noise coefficient exhibits an increase only by approximately 3 dB comparing with that where (Wp/Wn)=0/600.

(2) Where 0.5×VDD<Vop<0.8×VDD, the ratio (Wp/Wn) between the channel widths of the P-channel MOSFET and the N-channel MOSFET should be set approximately to 550/50$\leq$Wp/Wn$\leq$600/0.

The reason is that, as seen in FIG. 13, where the operating point is $0.5 \times VDD < Vop < 0.8 \times VDD$, the 1/f noise coefficient exhibits a minimum value at (Wp/Wn)=0/600, but where $550/50 \leq (Wp/Wn) \leq 600/0$, the 1/f noise coefficient exhibits an increase only by approximately 3 dB comparing with that where (Wp/wn)=600/0.

(3) Where $Vop \geq 0.8 \times VDD$, the channel width ratio (Wp/Wn) between the P-channel MOSFET and the N-channel MOSFET should be set approximately to $500/100 \leq (Wp/Wn) \leq 600/0$.

The reason is that, as seen in FIG. 13, where the operating point is $Vop \geq 0.8 \times VDD$, the 1/f noise coefficient exhibits its minimum value at (Wp/Wn)=600/0, but where $500/100 \leq (Wp/Wn) \leq 600/0$, the 1/f noise coefficient exhibits an increase only by approximately 3 dB comparing with that where (Wp/Wn)=600/0.

(4) Where operating point Vop is set to an arbitrary value within the range of 0 to VDD, the ratio (Wp/Wn) between the channel widths of the P-channel MOSFET and the N-channel MOSFET should be set to $525/75$ (Wp/Wn) $\leq 575/25$, and approximately to (Wp/Wn)=550/50.

The reason is that, as seen in FIG. 13, where operating point Vop is within the range of 0 to VDD, the characteristic of (Wp/Wn)=550/50 (curve e3) exhibits a substantially flat characteristic over the entire operation range, and an increase only by approximately 3 dB is exhibited where $525/75 \leq Wp/Wn \leq 575/25$.

If the horizontal switch is composed only of a P-channel MOSFET, then the 1/f noise coefficient exhibits a sudden increase within the range of $Vop \leq 0.5 \times VDD$ as seen from curve g3 of FIG. 13, but if the horizontal switch is composed only of an N-channel MOSFET, the 1/f noise coefficient exhibits a sudden increase within the range of $Vop \geq 0.5 \times VDD$ as seen from curve h3 of FIG. 13. Accordingly, operating point Vop is set so that it may not fall within the ranges mentioned above irrespective of the channel width.

It is to be noted that, while the present embodiment is described in connection with an example wherein control voltage VDD is fixed to 13 [V], if control voltage VDD increases, then the characteristics of 1/f noise coefficients Kp and Kn of the P-channel MOSFET and the N-channel MOSFET illustrated in FIG. 9 are shifted to higher operating point Vop side (to the right side in FIG. 9), but the resistance characteristic of the horizontal switch illustrated in FIG. 11 is shifted to higher operating point Vop side (to the right side in FIG. 11). On the contrary, if control voltage VDD decreases, then the characteristics of 1/f noise coefficients Kp and Kn of the P-channel MOSFET and the N-channel MOSFET illustrated in FIG. 9 are shifted to lower operating point Vop side (to the left side in FIG. 9), but the resistance characteristic of the horizontal switch illustrated in FIG. 11 is shifted to lower operating point Vop side (to the left side in FIG. 11). Accordingly, the noise reduction method of the present embodiment can be applied also to a case other than where control voltage VDD is 13 [V].

By the way, where channel length Lp of the P-channel MOSFET and channel length Ln of the N-channel MOSFET are equal to each other, the ratio (Wp/Wn) between channel width Wp of the P-channel MOSFET and channel width Wn of the N-channel MOSFET is equal to the ratio (Sp/Sn) between current driving capacities Sp and Sn of them.

In other words, the ratio (Wp/Wn) between the channel widths of the P-channel MOSFET and the N-channel MOSFET can be replaced by the ratio (Sp/Sn) between the current driving capacities in accordance with the rule of scaling.

Accordingly, a preferable range of the ratio (Wp/Wn) between the channel widths of the P-channel MOSFET and the N-channel MOSFET with respect to operating point Vop is set as a range of the ratio (Sp/Sn) in current driving capacity as given in (5) to (8) below:

(5) Where $Vop \leq 0.5 \times VDD$, the ratio (Sp/Sn) in current driving capacity should be set approximately to $0 \leq (Sp/Sn) \leq 5$.

(6) Where $0.5 \times VDD \leq Vop \leq 0.8 \times VDD$, the ratio (Sp/Sn) in current driving capacity should be set approximately to $11 \leq (Sp/Sn)$.

(7) Where $Vop \geq 0.8 \times VDD$, the ratio (Sp/Sn) in current driving capacity should be set approximately to $5 \leq (Sp/Sn)$.

(8) Where operating point Vop is set to an arbitrary value within the range of 0 to VDD, the ratio (Sp/Sn) in current driving capacity should be set to $7 \leq (Sp/Sn) \leq 23$, and approximately to (Wp/Sn)=11.

Since the dimensions of the MOSFETs which compose the semiconductor device are optimized in accordance with the procedure described above so that the 1/f noise coefficient may be minimized, an external circuit for minimizing the 1/f noise coefficient becomes unnecessary, and the construction of the semiconductor device can be simplified. Accordingly, minimization and reduction in power dissipation of the semiconductor device can be achieved.

While a preferred embodiments of the present invention has been described using specific terms, such description is for illustrative purposes only, and it is to be understood that changes and variations may be made without departing from the spirit or scope of the following claims.

What is claimed is:

1. A noise reduction method for a semiconductor device for suppressing a noise component of a semiconductor device which includes an element having an impedance and a MOSFET circuit which includes at least one MOSFET, comprising the steps of:

measuring a 1/f noise coefficient characteristic indicative of a relationship of a 1/f noise coefficient to an operating point of the semiconductor device using a control voltage to be applied to a gate of the MOSFET as a parameter; and applying, based on the 1/f noise coefficient characteristic, a control voltage corresponding to an operating point of the semiconductor device with which the 1/f noise coefficient is minimized within a range within which the MOSFET is operable.

2. The noise reduction method for a semiconductor device as claimed in claim 1, wherein, when the MOSFET circuit is composed of a P-channel MOSFET and an N-channel MOSFET connected in parallel and a current driving capacity of the P-channel MOSFET is represented by Sp, a current driving capacity of the N-channel MOSFET by Sn, a voltage of the operating point of the semiconductor device by Vop and a maximum voltage which can be applied to the gates and the substrates of the P-channel MOSFET and the N-channel MOSFET by VDDmax, when $Vop < 4/\{3 \times (Sp/Sn)\} \times VDDmax$, the control voltage is set to VDDmax, but when $Vop \geq 4/\{3 \times (Sp/Sn)\} \times VDDmax$, the control voltage is set to Vop.

3. The noise reduction method for a semiconductor device as claimed in claim 2, wherein a second control voltage corresponding to the operating point of the semiconductor device with which the 1/f noise coefficient is minimized within a range within which the P-channel MOSFET is operable based on the 1/f noise coefficient characteristic is applied to the substrate of the P-channel MOSFET.

4. A noise reduction method for a semiconductor device for suppressing a noise component of a semiconductor device which includes an element having an impedance and a MOSFET circuit which includes at least one MOSFET, comprising the steps of:

preparing in advance a MOSFET for measurement having a same circuit construction as that of the MOSFET circuit which is composed of a MOSFET having known element dimensions;

calculating a relationship of a 1/f noise coefficient to a channel area of the MOSFET using the MOSFET circuit for measurement;

calculating resistance values of the MOSFET and the MOSFET circuit using a channel width and a channel length presented by the channel area and a peculiar constant of the MOSFET;

calculating a 1/f noise coefficient of the semiconductor device using the 1/f noise coefficient to channel area relationship and the resistance values; and setting the channel width and the channel length of the MOSFET to values with which the 1/f noise coefficient of the semiconductor device is minimized.

5. The noise reduction method for a semiconductor device as claimed in claim 4, wherein, when the MOSFET circuit is composed of a P-channel MOSFET and an N-channel MOSFET connected in parallel, said noise reduction method comprising:

a first step of measuring 1/f noise coefficient characteristics for measurement indicative of relationships of 1/f noise coefficients to operating points of the P-channel MOSFET and the N-channel MOSFET which have known element dimensions using a control voltage to be applied to gates of the P-channel MOSFET and the N-channel MOSFET as a parameter and calculating first noise coefficients of the P-channel MOSFET and the N-channel MOSFET which have known element dimensions corresponding to a predetermined operating point and the control voltage to be applied to the semiconductor device based on the 1/f noise coefficient characteristics for measurement;

a second step of calculating, from channel areas and the first 1/f noise coefficients of the P-channel MOSFET and the N-channel MOSFET which have known element dimensions, first 1/f noise coefficient characteristics indicative of relationships of the 1/f noise coefficients to the channel areas of the P-channel MOSFET and the N-channel MOSFET of the MOSFET circuit;

a third step of calculating second 1/f noise coefficients of the P-channel MOSFET and the N-channel MOSFET selected arbitrarily from the first 1/f noise coefficient characteristics and channel areas of the P-channel MOSFET and the N-channel MOSFET corresponding to the second 1/f noise coefficients using the first 1/f noise coefficient characteristics to determine channel widths and channel lengths of the P-channel MOSFET and the N-channel MOSFET;

a fourth step of calculating a resistance value of the P-channel MOSFET, a resistance value of the N-channel MOSFET and a resistance value of the MOSFET circuit based on the channel widths and the channel lengths;

a fifth step of calculating, where the second 1/f noise coefficient of the P-channel MOSFET is represented by Kp1, the resistance value of the P-channel MOSFET by Rp1, the second 1/f noise coefficient of the N-channel MOSFET by Kn1 and the resistance value of the N-channel MOSFET by Rn1, a 1/f noise coefficient KH1 of the MOSFET circuit in accordance with $$KH1 = \frac{Kp1 \cdot Rn1^2 + Kn1 \cdot Rp1^2}{(Rp1 + Rn1)^2}$$

and a sixth step of calculating, where the 1/f noise coefficients of the elements are represented by Ki and the resistance values of the elements by Ri and i are positive numbers from 1 to N, a 1/f noise coefficient KALL of the semiconductor device in accordance with $$KALL1 = \frac{KH1 \cdot RH1^2 + K_1 \cdot R_1^2 + K_2 \cdot R_2^2 + \ldots + K_N \cdot R_N^2}{(RH1 + R_1 + R_2 + \ldots + R_N)^2}$$

the channel widths and the channel lengths of the P-channel MOSFET and the N-channel MOSFET being varied to repeat the third to sixth steps to determine channel widths and channel lengths of the P-channel MOSFET and the N-channel MOSFET with which the 1/f noise coefficient is minimized with a predetermined operating point and the control voltage of the semiconductor device.

6. The noise reduction method for a semiconductor device as claimed in claim 5, wherein, when the operating point of the semiconductor device is represented by Vop, the control voltage by VDD, a current driving capacity of the P-channel MOSFET by Sp and a current driving capacity of the N-channel MOSFET by Sn, a ratio (Sp/Sn) in current driving capacity is set to $0 \leq (Sp/Sn) \leq 5$ when $Vop \leq 0.5 \times VDD$, but set to $11 \leq (Sp/Sn)$ when $0.5 \times VDD \leq Vop \leq 0.8 \times VDD$, but set to $5 \leq (Sp/Sn)$ when $Vop \geq 0.8 \times VDD$.

7. The noise reduction method for a semiconductor device as claimed in claim 5, wherein, when a current driving capacity of the P-channel MOSFET is represented by Sp and a current driving capacity of the N-channel MOSFET by Sn, a ratio (Sp/Sn) in current driving capacity is set to $7 \leq (Sp/Sn) \leq 23$.

8. The noise reduction method for a semiconductor device as claimed in claim 7, wherein, when the current driving capacity of the P-channel MOSFET is represented by Sp and the current driving capacity of the N-channel MOSFET by Sn, the ratio (Sp/Sn) in current driving capacity is set (Sp/Sn)=11.

* * * * *